United States Patent
Hashimoto et al.

(10) Patent No.: US 10,586,698 B2
(45) Date of Patent: Mar. 10, 2020

(54) METHOD OF MANUFACTURING SEMICONDUCTOR DEVICE, SUBSTRATE PROCESSING APPARATUS AND RECORDING MEDIUM

(71) Applicant: Hitachi Kokusai Electric Inc., Tokyo (JP)

(72) Inventors: Yoshitomo Hashimoto, Toyama (JP); Yushin Takasawa, Toyama (JP); Masaya Nagato, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 15/456,284

(22) Filed: Mar. 10, 2017

(65) Prior Publication Data
US 2017/0263439 A1     Sep. 14, 2017

(30) Foreign Application Priority Data
Mar. 11, 2016    (JP) .................................. 2016-048126

(51) Int. Cl.
*H01L 21/02*     (2006.01)
*C23C 16/30*     (2006.01)
(Continued)

(52) U.S. Cl.
CPC .......... *H01L 21/0228* (2013.01); *C23C 16/30* (2013.01); *C23C 16/308* (2013.01);
(Continued)

(58) Field of Classification Search
CPC . B82Y 10/00; B82Y 40/00; H01L 21/823412; H01L 21/823418;
(Continued)

(56) References Cited

U.S. PATENT DOCUMENTS

2005/0242376 A1* 11/2005 Chen ................... H01L 29/6653
                                                                        257/214
2013/0015533 A1* 1/2013 Wang ..................... B82Y 40/00
                                                                      257/390
(Continued)

FOREIGN PATENT DOCUMENTS

JP        2004158832 A    6/2004
JP        2005159008 A    6/2005
(Continued)

OTHER PUBLICATIONS

Office Action in corresponding Korean Patent Application No. 10-2017-0028227, dated Mar. 21, 2018, with English translation.
Office Action in corresponding Japanese Patent Application No. 2016-048126, dated Jan. 31, 2019, including English translation.
Office Action in corresponding Korean Patent Application No. 10-2017-0028227, dated Oct. 7, 2018, with English translation.

*Primary Examiner* — Edward Chin
(74) *Attorney, Agent, or Firm* — Edell, Shapiro & Finnan, LLC

(57) ABSTRACT

The present disclosure provides a technique including a method of manufacturing a semiconductor device, which is capable of improving the characteristics of a film formed on a substrate. The method of manufacturing a semiconductor device may include: (a) forming a first film containing a predetermined element, oxygen, carbon and nitrogen on a substrate; and (b) forming a second film thinner than the first film on a top surface of the first film, the second film having an oxygen concentration lower than an oxygen concentration of the first film or having oxygen and carbon concentrations lower than oxygen and carbon concentrations of the first film.

16 Claims, 9 Drawing Sheets

(51) Int. Cl.
*C23C 16/34* (2006.01)
*C23C 16/36* (2006.01)
*C23C 16/455* (2006.01)
*C23C 16/448* (2006.01)
*C23C 16/52* (2006.01)

(52) U.S. Cl.
CPC ............ *C23C 16/345* (2013.01); *C23C 16/36* (2013.01); *C23C 16/4482* (2013.01); *C23C 16/45527* (2013.01); *C23C 16/45531* (2013.01); *C23C 16/45544* (2013.01); *C23C 16/52* (2013.01); *H01L 21/0217* (2013.01); *H01L 21/02126* (2013.01); *H01L 21/02167* (2013.01); *H01L 21/02211* (2013.01); *H01L 21/02362* (2013.01)

(58) Field of Classification Search
CPC ..... H01L 21/823807; H01L 21/823814; H01L 29/42372; H01L 29/6656; H01L 29/66628; H01L 29/66636
USPC ............ 257/E21.435, E27.06, 390; 438/301; 977/755
See application file for complete search history.

(56) References Cited

U.S. PATENT DOCUMENTS

| | | | |
|---|---|---|---|
| 2013/0149873 A1* | 6/2013 | Hirose | ............... H01L 21/31 438/763 |
| 2013/0149874 A1* | 6/2013 | Hirose | ............. H01L 21/02271 438/763 |
| 2016/0024659 A1 | 1/2016 | Shimamoto et al. | |
| 2016/0071720 A1 | 3/2016 | Nitta et al. | |
| 2016/0245704 A1* | 8/2016 | Osaka | ..................... G01K 7/02 |

FOREIGN PATENT DOCUMENTS

| | | |
|---|---|---|
| JP | 2012-015344 A | 1/2012 |
| JP | 2013-140994 A | 7/2013 |
| JP | 2014146670 A | 8/2014 |
| JP | 2015035477 A | 2/2015 |
| KR | 10-2013-0065610 A | 6/2013 |
| KR | 1020130065606 A | 6/2013 |
| KR | 10-2016-0012086 A | 2/2016 |

* cited by examiner

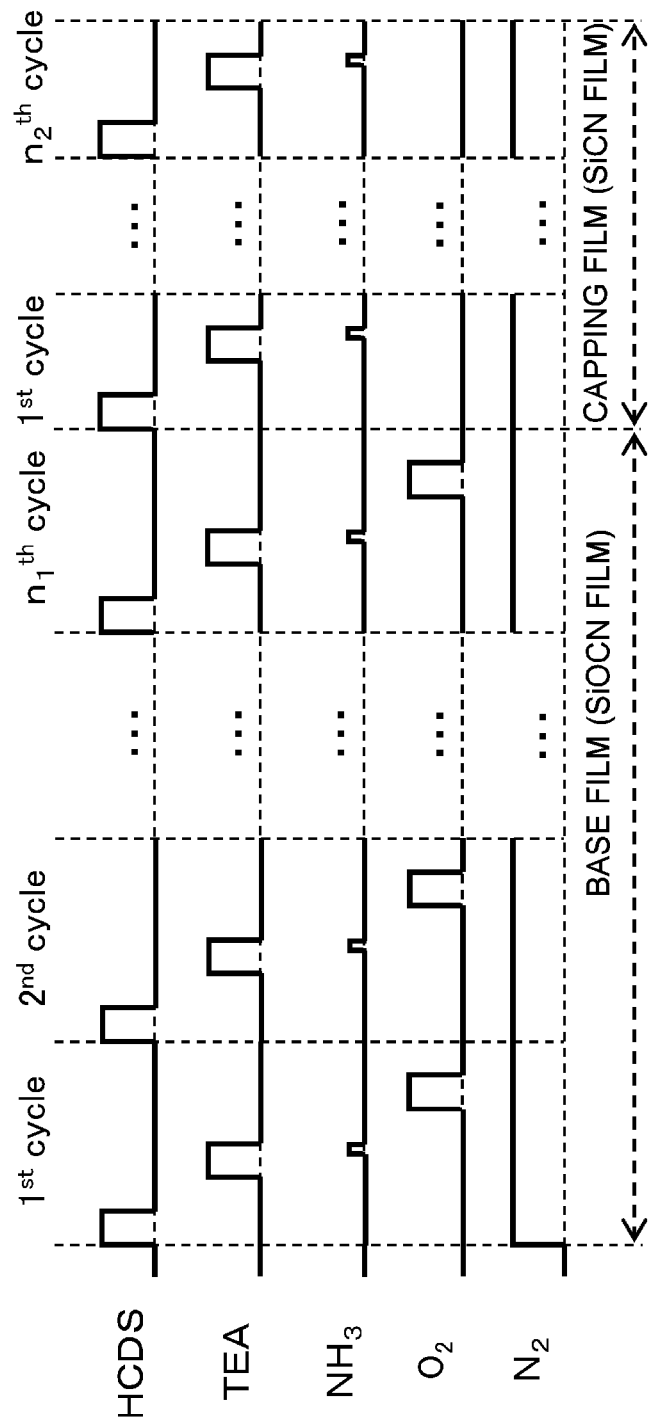

FIG. 5A

| | FIRST SAMPLE | SECOND SAMPLE | THIRD SAMPLE | FOURTH SAMPLE |
|---|---|---|---|---|
| FILM STRUCTURE | SiOCN FILM / WAFER | O-POOR SiOCN FILM / SiOCN FILM / WAFER | SiCN FILM / SiOCN FILM / WAFER | SiN FILM / SiOCN FILM / WAFER |
| DIELECTRIC CONSTANT (k value) | 4.4 | 4.74 | 5.43 | 4.96 |

METHOD OF MANUFACTURING SEMICONDUCTOR DEVICE, SUBSTRATE PROCESSING APPARATUS AND RECORDING MEDIUM

CROSS REFERENCE TO RELATED APPLICATIONS

This application claims foreign priority under 35 U.S.C. § 119(a)-(d) to Application No. JP 2016-048126, filed on Mar. 11, 2016, the entire contents of which are hereby incorporated by reference.

FIELD OF THE INVENTION

The present disclosure relates to a method of manufacturing a semiconductor device, a substrate processing apparatus and a recording medium.

BACKGROUND

A processing of forming a multi-component film containing a predetermined element such as silicon (Si), oxygen (O), carbon (C) and nitrogen (N), for example, may be performed as one of processes for manufacturing a semiconductor device.

SUMMARY

Described herein is a technique capable of improving the characteristics of a film formed on a substrate.

According to one aspect described herein, a technique is provided that includes a method of manufacturing a semiconductor device, the method including: (a) forming a first film containing a predetermined element, oxygen, carbon and nitrogen on a substrate; and (b) forming a second film thinner than the first film on a top surface of the first film, the second film having an oxygen concentration lower than an oxygen concentration of the first film or having oxygen and carbon concentrations lower than oxygen and carbon concentrations of the first film.

BRIEF DESCRIPTION OF THE DRAWINGS

FIGS. 4B and 4C are diagrams exemplifying modifications of the film forming sequence according to the embodiment described herein.

FIG. 5A is a diagram exemplifying stacked structures of films formed on a substrate and dielectric constants thereof.

DETAILED DESCRIPTION

Embodiment

Hereafter, an embodiment will be described with reference to FIGS. 1 through 3.

(1) Configuration of Substrate Processing Apparatus

Figure 1:
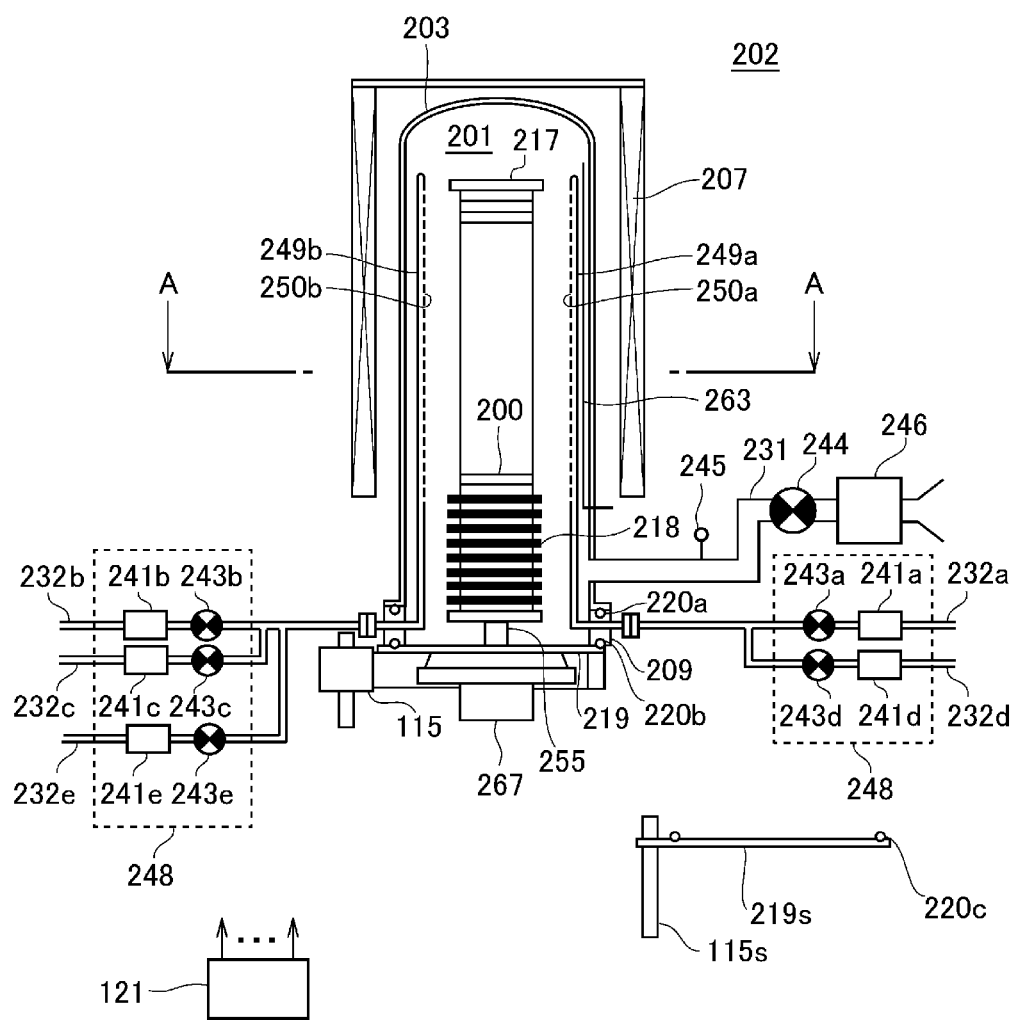
FIG. 1 is a diagram schematically illustrating a longitudinal section of a vertical process furnace of a substrate processing apparatus which is used in an embodiment described herein.

As illustrated in FIG. 1, a process furnace 202 includes a heater 207 serving as a heating mechanism (temperature adjusting unit). The heater 207 is cylindrical, and vertically installed while being supported by a support plate. The heater 207 also functions as an activation mechanism (excitation unit) for activating (exciting) a gas into heat.

A reaction tube 203 is installed in the heater 207 so as to be concentric with the heater 207. The reaction tube 203 is made of a heat-resisting material such as quartz ($SiO_2$) and silicon carbide (SiC), and cylindrical with a closed upper end and an open lower end. A manifold 209 is installed under the reaction tube 203 so as to be concentric with the reaction tube 203. The manifold 209 is made of a metal such as stainless steel (SUS), and cylindrical with open upper and lower ends. The upper end of the manifold 209 is engaged with the lower end of the reaction tube 203 so as to support the reaction tube 203. An O-ring 220a serving as a sealing member is installed between the manifold 209 and the reaction tube 203. The reaction tube 203 is vertically installed like the heater 207. A processing vessel (reaction vessel) is constituted by the reaction tube 203 and the manifold 209. A process chamber 201 is installed in the hollow cylindrical portion of the processing vessel. The process chamber 201 may house a plurality of wafers 200 as substrates.

Nozzles 249a and 249b are installed in the process chamber 201 through sidewalls of the manifold 209. Gas supply pipes 232a and 232b are connected to the respective nozzles 249a and 249b. A gas supply pipe 232c is connected to the gas supply pipe 232b.

MFCs (Mass Flow Controllers) 241a to 241c serving as flow rate controllers (flow rate control units) and valves 243a through 243c serving as opening/closing valves are sequentially installed at the respective gas supply pipes 232a through 232c from the upstream side toward the downstream side of the gas supply pipes 232a through 232c. Gas supply pipes 232d and 232e for supplying an inert gas are connected to the gas supply pipes 232a and 232b at the downstream sides of the valves 243a and 243c, respectively. MFCs 241d and 241e and valves 243d and 243e are sequentially installed at the gas supply pipes 232d and 232e from the upstream side toward the downstream side of the gas supply pipes 232d and 232e.

Figure 2:
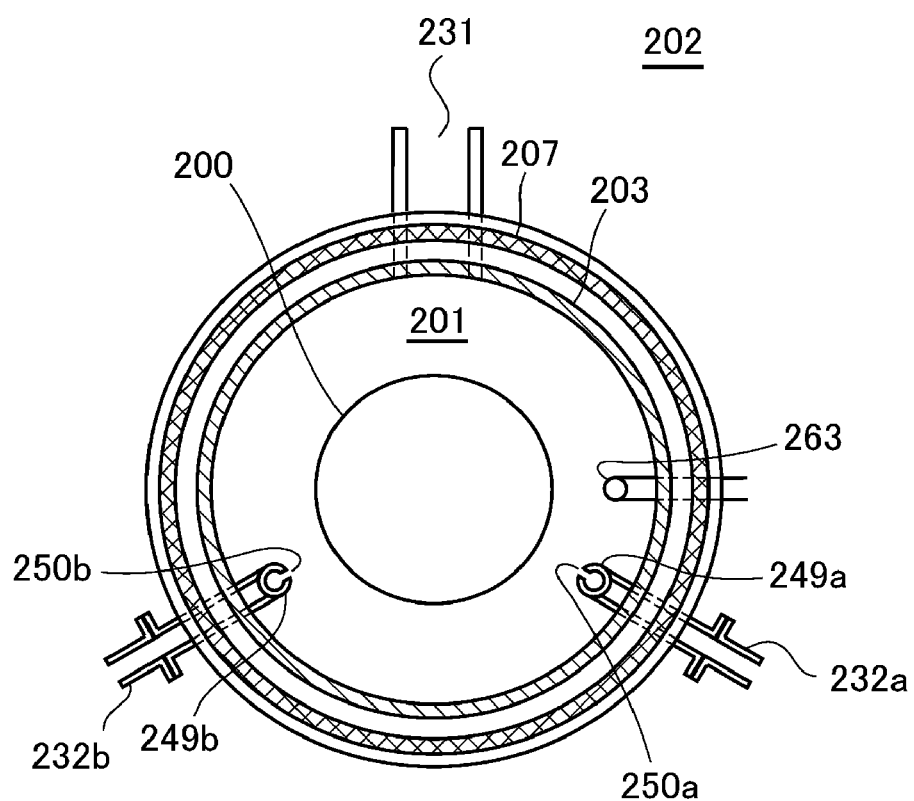
FIG. 2 is a cross-sectional view taken along the line A-A of FIG. 1, schematically illustrating a portion of the vertical process furnace of the substrate processing apparatus which is used in the embodiment described herein.

As illustrated in FIG. 2, the nozzles 249a and 249b are installed in a space between the inner wall of the reaction tube 203 and wafers 200 so as to extend from bottom to top of the inner wall of the reaction tube 203 along the stacking direction of the wafers 200, the space having an annular shape when seen from the top. That is, the nozzles 249a and 249b are installed in regions which are formed at sides of the wafer arrangement region where the wafers 200 are arranged, and horizontally surround the wafer arrangement region, while extending along the wafer arrangement region. A plurality of gas supply holes 250a and a plurality of gas supply holes 250b are disposed at the side surfaces of the nozzles 249a and 249b, respectively. The plurality of gas supply holes 250a and 250b may be open toward the center of the reaction tube 203, and configured to supply a gas toward the wafer 200. The plurality of gas supply holes 250a and 250b are disposed across the reaction tube 203 from bottom to top thereof.

According to the present embodiment, gas is supplied through the nozzles 249a and 249b arranged in the vertically long annular space which is defined by the inner walls of the sidewalls of the reaction tube 230 and the ends (peripheries) of the plurality of wafers 200 arranged in the reaction tube 203, that is, the cylindrical space. The gas is first jetted into the reaction tube 203 around the wafers 200 through the plurality of gas supply holes 250a and 250b installed in the nozzles 249a and 249b, respectively. The gas flows in the reaction tube 203 mainly in a direction parallel to the surface of the wafer 200, that is, the horizontal direction. Such a configuration can uniformly supply the gas to each of the wafers 200. The gas having flown on the surface of the wafer 200 flows toward an exhaust port, that is, an exhaust pipe 231 described later. However, the flow direction of the gas is properly specified by the location of the exhaust port, and not limited to the vertical direction.

A gas containing a predetermined element (source gas), for example, a halosilane-based gas containing silicon (Si) and halogen elements is supplied to the process chamber 201 through the MFC 241a, the valve 243a and the nozzle 249a which are installed at the gas supply pipe 232a.

The source gas includes a gaseous source, for example, a gas obtained by evaporating a source in liquid state under normal temperature and pressure and a source in gaseous state under normal temperature and pressure. Halosilane is silane containing a halogen group. The halogen group includes groups such as a chloro group, a fluoro group, a bromo group and an iodine group. That is, the halogen group includes halogen elements such as chlorine (Cl), fluorine (F), bromine (Br) and iodine (I).

For example, a source gas containing silicon and chlorine, that is, a chlorosilane-based gas may be used as the halosilane-based gas. The chlorosilane-based gas serves as a silicon source. For example, hexachlorodisilane ($Si_2Cl_6$, abbreviated to HCDS) gas may be used as the chlorosilane-based gas.

A first reactant having a different chemical structure (molecular structure) from the source gas, for example, a gas containing carbon and nitrogen is supplied into the process chamber 201 through the MFC 241b, the valve 243b and the nozzle 249b, which are installed at the gas supply pipe 232b.

For example, an amine-based gas may be used as the gas containing carbon and nitrogen. The amine-based gas is a gas containing an amine group. The amine-based gas includes a gaseous amine, for example, a gas which can be obtained by evaporating amine in liquid state under normal temperature and pressure and amine in gaseous state under normal temperature and pressure. The amine-based gas includes amines such as ethylamine, methylamine, propylamine, isopropylamine, butylamine and isobutylamine. The amine collectively refers to compounds obtained by substituting hydrogen (H) of ammonia ($NH_3$) with a hydrocarbon group. The amine contains a hydrocarbon group such as an alkyl group which is a carbon-containing ligand, i.e. organic ligand. Since the amine-based gas contains three elements of carbon, nitrogen and hydrogen and does not contain silicon, the amine-based gas may be referred to as a gas free of silicon. Moreover, since the amine-based gas does not contain silicon and metal, the amine-based gas may also be referred to as a gas free of silicon and metal. The amine-based gas may also be referred to as a substance constituted by only three elements of carbon, nitrogen and hydrogen. The amine-based gas not only serves as a carbon source, but also serves as a nitrogen source.

For example, triethylamine (($C_2H_5$)$_3$N, abbreviated to TEA) gas may be used as the amine-based gas. The TEA gas contains a plurality of organic ligands (ethyl groups) in one molecule thereof, and the number of carbon elements contained in one molecule of the TEA gas is larger than the number of nitrogen elements.

A third reactant having a different chemical structure (molecular structure) from the source gas, for example, an oxygen-containing gas is supplied into the process chamber 201 through the MFC 241b, the valve 243b and the nozzle 249b which are installed at the gas supply pipe 232b. The oxygen-containing gas serves as an oxidizing gas, i.e. oxygen source. For example, $O_2$ gas may be used as the oxygen-containing gas.

A second reactant having a different chemical structure (molecular structure) from the source gas, for example, a nitrogen-containing gas is supplied into the process chamber 201 through the MFC 241c, the valve 243c, the gas supply pipe 232b and the nozzle 249b which are installed at the gas supply pipe 232c. For example, a hydronitrogen-based gas may be used as the nitrogen-containing gas. The hydronitrogen-based gas may be referred to as a substance constituted by only two elements such as nitrogen and hydrogen, and serves as a nitriding gas, i.e. nitrogen source. For example, ammonia ($NH_3$) gas may be used as the hydronitrogen-based gas.

An inert gas, for example, N2 gas is supplied into the process chamber 201 through the MFCs 241d and 241e, the valves 243d and 243e, the gas supply pipes 232a and 232b and the nozzles 249a and 249b, which are installed at the gas supply pipes 232d and 232e, respectively.

A source (source gas) supply system includes the gas supply pipe 232a, the MFC 241a and the valve 243a. A first reactant (gas containing carbon and nitrogen) supply system includes the gas supply pipe 232b, the MFC 241b and the valve 243b. A second reactant (nitrogen-containing gas) supply system includes the gas supply pipe 232c, the MFC 241c and the valve 243c. A third reactant (oxygen-containing gas) supply system includes the gas supply pipe 232b, the MFC 241b and the valve 243b. An inert gas supply system includes the gas supply pipes 232d and 232e, the MFCs 241d and 241e and the valves 243d and 243e. The supply systems are collectively and simply referred to as a gas supply system.

Any one or all of the above-described supply systems may be embodied as an integrated gas supply system 248 in which the components such as the valves 243a through 243e or the MFCs 241a through 241e are integrated. The integrated gas supply system 248 is connected to the respective gas supply pipes 232a through 232e. An operation of the integrated gas supply system 248 to supply various gases to the gas supply pipes 232a through 232e, for example, operations such as an operation of opening/closing the valves 243a through 243e and an operation of adjusting a flow rate through the MFCs 241a through 241e may be controlled by a controller 121 described later. The integrated gas supply system 248 may be embodied as an integrated unit having an all-in-one or divided structure. The components of the integrated gas supply system 248, such as the gas supply pipes 232a through 232e, can be attached/detached on a basis of the integrated unit. Operations such as maintenance, exchange and addition of the integrated gas supply system 248 may be performed on a basis of the integrated unit.

The exhaust pipe 231 for exhausting the inner atmosphere of the process chamber 201 is installed at the reaction tube 203. A vacuum pump 246 serving as a vacuum exhauster is connected to the exhaust pipe 231 through a pressure sensor 245 and an APC (Automatic Pressure Controller) valve 244. The pressure sensor 245 serves as a pressure detector (pressure detection unit) to detect the inner pressure of the process chamber 201, and the APC valve 244 serves as a pressure controller (pressure control unit). With the vacuum pump 246 in operation, the APC valve 244 may be opened/closed to vacuum-exhaust the process chamber 201 or stop the vacuum exhaust. With the vacuum pump 246 in operation, the opening degree of the APC valve 244 may be adjusted based on the pressure detected by the pressure sensor 245, in order to control the inner pressure of the process chamber 201. An exhaust system includes the exhaust pipe 231, the APC valve 244 and the pressure sensor 245. The exhaust system may further include the vacuum pump 246.

A seal cap 219 serving as a furnace opening cover can airtightly seal the lower end opening of the manifold 209, and is installed under the manifold 209. The seal cap 219 is made of metal such as SUS, and formed in a disk shape. The O-ring 220b serving as a sealing member is installed on the upper surface of the seal cap 219 so as to be in contact with the lower end of the manifold 209. A rotating mechanism 267 to rotate a boat 217 described later is installed under the seal cap 219. The rotating mechanism 267 includes a rotating shaft 255 connected to the boat 217 through the seal cap 219. As the rotating mechanism 267 rotates the boat 217, the wafer 200 is rotated. The seal cap 219 may be moved upward/downward in the vertical direction by a boat elevator 115 installed outside the reaction tube 203 and serving as an elevating mechanism. When the seal cap 219 is moved upward/downward by the boat elevator 115, the boat 217 may be loaded into the process chamber 201 or unloaded out of the process chamber 201. The boat elevator 115 serves as a transfer device (transfer mechanism) that loads the boat 217, that is, the wafer 200 into the process chamber 201 or unloads the boat 217, that is, the wafer 200 out of the process chamber 201. A shutter 219s is installed under the manifold 209. While the seal cap 219 is lowered by the boat elevator 115, the shutter 219s can airtightly close the lower end opening of the manifold 209. The shutter 219s is made of metal such as SUS, and formed in a disk shape. An O-ring 220c serving as a sealing member to be in contact with the lower end of the manifold 209 is installed on the upper surface of the shutter 219s. A shutter opening/closing mechanism 115s controls an operation of opening/closing the shutter 219s, for example, an elevating operation or rotating operation.

The boat 217 serving as a substrate support aligns a plurality of wafers 200, for example, 25 to 200 wafers 200 in the vertical direction and supports the plurality of wafers 200, while the wafers 200 are horizontally positioned and centered with each other. That is, the plurality of wafers 200, for example, 25 to 200 wafers 200 are arranged in the boat 217, with a space provided therebetween. The boat 217 is made of a heat-resisting material such as quartz and SiC. An insulating plate 218 is made of a heat resisting material such as quartz and SiC, and installed in multi-stages under the boat 217. The insulating plate 218 makes it difficult to transmit heat from a heater 207 to the seal cap 219. Instead of the insulating plate 218, a heat insulating cylinder may be installed as a cylindrical member made of a heat resisting material such as quartz and SiC.

A temperature sensor 263 serving as a temperature detector is installed in the reaction tube 203. The state of electricity conducted to the heater 207 is adjusted based on the temperature detected by the temperature sensor 263, such that the internal temperature of the process chamber 201 has a desired temperature distribution. The temperature sensor 263 is L-shaped like the nozzles 249a and 249b, and installed along the inner wall of the reaction tube 203.

Figure 3:
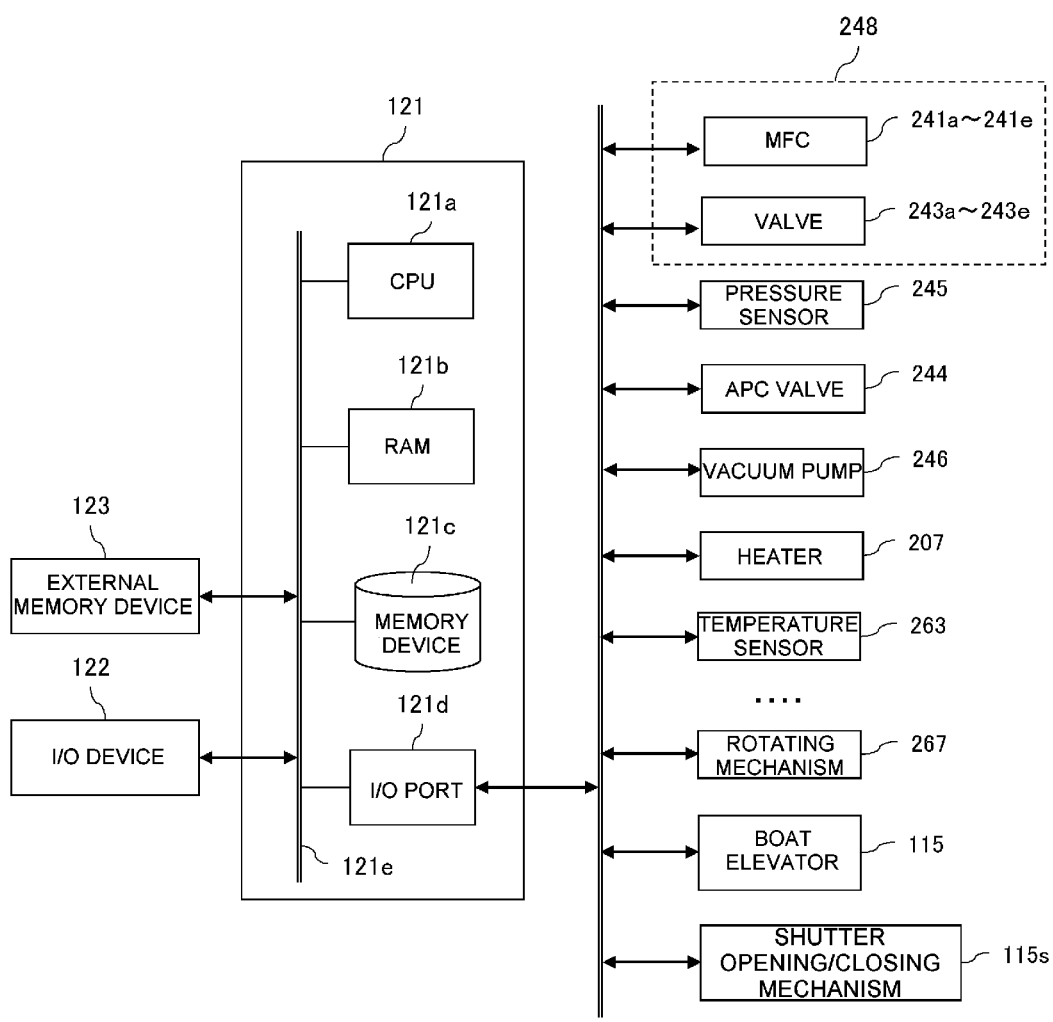
FIG. 3 is a block diagram schematically illustrating a control system of a controller in the substrate processing apparatus which is used in the embodiment described herein.

As illustrated in FIG. 3, the controller 121 serving as a control unit is embodied by a computer including a CPU (Central Processing Unit) 121a, a RAM (Random Access Memory) 121b, a memory device 121c and an I/O port 121d. The RAM 121b, the memory device 121c and the I/O port 121d may exchange data with the CPU 121a through an internal bus 121e. For example, an I/O device 122 such as a touch panel is connected to the controller 121.

The memory device 121c is embodied by components such as a flash memory and HDD (Hard Disk Drive). A control program for controlling the operation of the substrate processing apparatus or a process recipe containing information on the sequence and conditions of a film forming process described later is readably stored in the memory device 121c. The process recipe is obtained by combining steps of the film forming process described later such that the controller 121 can execute the steps to acquire a predetermine result, and functions as a program. Hereafter, the process recipe and the control program are collectively referred to as a program. The process recipe is simply referred to as a recipe. In this specification, "program" may indicate only the recipe, indicate only the control program, or indicate both of them. The RAM 121b is a work area where a program or data read by the CPU 121a is temporarily stored.

The I/O port 121d is connected to the above-described components such as the MFCs 241a through 241e, the valves 243a through 243e, the pressure sensor 245, the APC valve 244, the vacuum pump 246, the temperature sensor 263, the heater 207, the rotating mechanism 267, the boat elevator 115 and the shutter opening/closing mechanism 115s.

The CPU 121a is configured to read a control program from the memory device 121c and execute the read control program. Furthermore, the CPU 121a is configured to read a recipe from the memory device 121c according to an operation command inputted from the I/O device 122. According to the contents of the read recipe, the CPU 121a may control various operations such as flow rate adjusting operations for various gases by the MFCs 241a through 241e, opening/closing operations of the valves 243a through 243e, an opening/closing operation of the APC valve 244, a pressure adjusting operation by the APC valve 244 based on the pressure sensor 245, a start and stop of the vacuum pump 246, a temperature adjusting operation of the heater 207 based on the temperature sensor 263, a rotation operation and rotation speed adjusting operation of the boat 217 by the rotating mechanism 267, an elevating operation of the boat 217 by the boat elevator 115, and an opening/closing operation of the shutter 219s by the shutter opening/closing mechanism 115s.

The controller 121 may be embodied by installing the above-described program stored in an external memory device 123 into a computer, the external memory device 123 including a magnetic disk such as a hard disk, an optical disk such as CD and DVD, a magneto-optical disk such as MO, and a semiconductor memory such as a USB memory. The memory device 121c or the external memory device 123 may be embodied by a transitory computer readable recording medium. Hereafter, the memory device 121c and the external memory device 123 are collectively referred to as recording media. In this specification, "recording media" may indicate only the memory device 121c, indicate only the external memory device 123, and indicate both of the memory device 121c and the external memory device 123. In addition to the external memory device 123, a communication unit such as the Internet and dedicated line may be used as the unit for providing a program to a computer.

(2) Film Forming Process

Figure 4A:
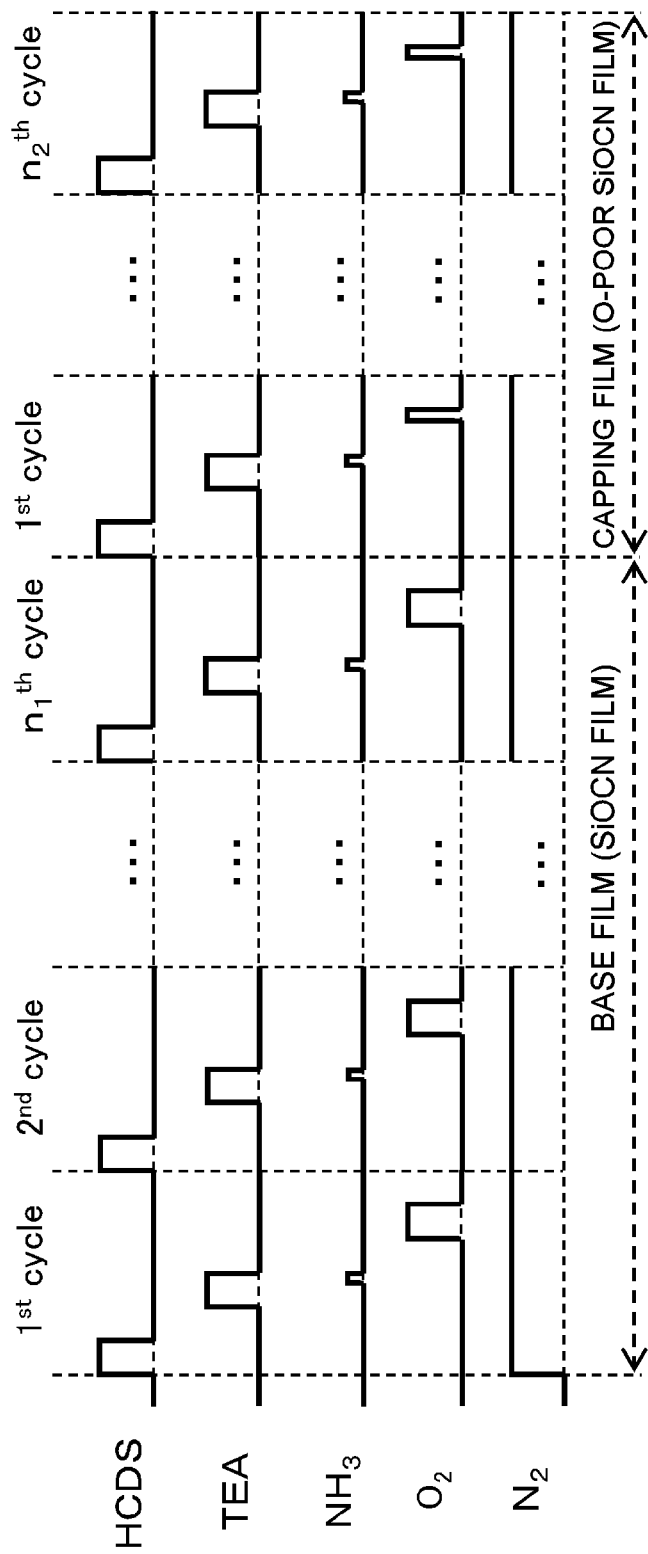
FIG. 4A is a diagram exemplifying a film forming sequence according to the embodiment described herein.

Referring to FIG. 4A, an example of a sequence of forming a film on a substrate using the above-described substrate processing apparatus will be described as one of processes for manufacturing a semiconductor device. In the following descriptions, the controller 121 controls the components constituting the substrate processing apparatus.

The film forming sequence illustrated in FIG. 4A includes a first film forming step of forming a silicon oxycarbonitride (SiOCN) film as a first film (bulk film or base film) on the wafer 200 serving as a substrate, the first film containing silicon, oxygen, carbon and nitrogen, and a second film forming step of forming on the top surface of the first film a SiOCN film (second film) thinner than the first film, the second film serving as a capping layer and having a lower oxygen concentration or lower oxygen and carbon concentrations than the first film.

At the first film forming step, a cycle (first cycle) is performed a predetermined number of times (n1 times) where n1 is an integer number equal to or more than 1, the cycle including a step 1 of supplying HCDS gas to the wafer 200, a step 2a of supplying TEA gas to the wafer 200, a step 2b of supplying $NH_3$ gas to the wafer 200, and a step 3 of supplying O2 gas to the wafer 200. The steps 1, 2a and 3 are performed non-simultaneously. The step 2b may be performed at the same time as the step 2a. That is, the step 2b may be performed while the step 2a is performed. The amount of $NH_3$ gas supplied at the step 2b is smaller than the number of TEA gas supplied at the step 2a. Thus, the nitrogen concentration of the first film may be adjusted to a lower concentration than the carbon concentration of the first film and the silicon and oxygen concentrations of the first film.

At the second film forming step, a cycle (second cycle) having substantially the same processing sequence as the first cycle is performed a predetermined number of times (n2 times), where n2 is an integer equal to or more than 1. The amount of $O_2$ gas supplied per cycle at the second film forming step is adjusted to a smaller amount than the amount of $O_2$ gas supplied per cycle at the first film forming step. Therefore, the oxygen concentration of the second film is lower than the oxygen concentration of the first film, and the nitrogen and carbon concentrations of the second film are higher than the nitrogen and carbon concentrations of the first film. Since the oxygen concentration of the second film is lower than the oxygen concentration of the first film, the second film is referred to as oxygen-poor SiOCN film.

In this specification, the film forming sequence illustrated in FIG. 4A may be expressed below, for convenience of description. When the following modifications are described, the film forming sequence may be expressed in the same manner.

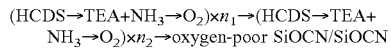
(HCDS→TEA+$NH_3$→$O_2$)×$n_1$→(HCDS→TEA+$NH_3$→$O_2$)×$n_2$→oxygen-poor SiOCN/SiOCN In this specification, "wafer" may indicate "a wafer itself" or indicate "a wafer and a stacked body (aggregate body) of predetermined layers or films formed on the surface of the wafer". That is, the wafer and the predetermined layers or films formed on the surface of the wafer may be collectively referred to as the wafer. In this specification, "surface of wafer" indicates "a surface (exposed surface) of a wafer" or "the surface of a predetermined layer or film formed on the wafer, i.e. the top surface of the wafer as a stacked body".

Thus, in this specification, "supplying a predetermined gas onto a wafer" may indicate "directly supplying the predetermined gas onto a surface of the wafer", or indicate "supplying the predetermined gas to a layer or film formed on the wafer, that is, the top surface of the wafer as a stacked body". In this specification, "forming a predetermined film or layer on a wafer" may indicate "directly forming the predetermined film or layer on a surface of the wafer", or indicate "forming the predetermined film or layer on a film or layer formed on the wafer, that is, the top surface of the wafer as a stacked body".

In this specification, "substrate" and "wafer" may be used as substantially the same meaning.

Wafer Charging and Boat Loading

When the boat 217 is charged with wafers 200 (wafer charging), the shutter opening/closing mechanism 115s moves the shutter 219s to open the lower end opening of the manifold 209 (shutter open). Then, as illustrated in FIG. 1, the boat 217 charged with the wafers 200 is lifted by the boat elevator 115 and loaded into the process chamber 201 (boat loading). The seal cap 219 seals the lower end of the manifold 209 through the O-ring 220.

Pressure and Temperature Adjusting Step

The vacuum pump 246 vacuum-exhausts the process chamber 201 such that the inner pressure of the process chamber 201, that is, the pressure of the space in which the wafers 200 are present is set to a desired pressure (vacuum degree). At this time, the inner pressure of the process chamber 201 is measured by the pressure sensor 245, and the APC valve 244 is feedback controlled based on the measured pressure. The vacuum pump 246 is continuously operated until at least the process for the wafers 200 is ended. The heater 207 heats the process chamber 201 such that the temperature of the wafer 200 in the process chamber 201 becomes a desired film forming temperature. The state of electricity conducted to the heater 207 is feedback controlled based on the temperature detected by the temperature sensor 263, such that the internal temperature of the process chamber 201 has a desired temperature distribution. The heater 207 continuously heats the process chamber 201 until at least the process for the wafers 200 is ended. The rotating mechanism 267 starts to rotate the boat 217 and the wafer 200. Until at least the process for the wafers 200 is ended, the rotating mechanism 267 continuously rotates the boat 217 and the wafer 200.

First Film Forming Step

Next, the step 1, the step 2a, the step 2b and the step 3 are performed according to timings described later.

[Step 1]

At the step 1, HCDS gas is supplied to the wafer 200 in the process chamber 201.

Specifically, the valve 243a is opened to supply HCDS gas into the gas supply pipe 232a. While the flow rate of HCDS gas is adjusted by the MFC 241a, the HCDS gas is supplied into the process chamber 201 through the nozzle 249a, and exhausted through the exhaust pipe 231. In this way, the HCDS gas is supplied to the wafer 200. Simultaneously, the valve 243d is opened to supply $N_2$ gas into the gas supply pipe 232d. While the flow rate of $N_2$ gas is adjusted by the MFC 241d, the $N_2$ gas is supplied with the HCDS gas into the process chamber 201, and exhausted through the exhaust pipe 231. In order to prevent the HCDS gas from permeating into the nozzle 249b, the valve 243e is opened to supply $N_2$ gas into the gas supply pipe 232e. The $N_2$ gas is supplied into the process chamber 201 through the gas supply pipe 232b and the nozzle 249b, and exhausted through the exhaust pipe 231.

The flow rate of the supplied HCDS gas may range from 1 sccm to 2,000 sccm, or desirably from 10 sccm to 1,000 sccm. The flow rate of the $N_2$ gas supplied through each of the gas supply pipes may range from 100 sccm to 10,000 sccm. The supply duration of the HCDS gas may range from 1 second to 120 seconds, or desirably from 1 second to 60 seconds. The inner pressure of the process chamber 201 may range from 1 Pa to 2,666 Pa, or desirably ranges from 67 Pa to 1,333 Pa. The temperature (film forming temperature) of the wafer 200 may range from 250° C. to 800° C., desirably from 400° C. to 750° C., or more desirably from 550° C. to 700° C.

When the film forming temperature is less than 250° C., a practical film forming speed cannot be acquired because HCDS becomes difficult to chemically adsorb on the wafer 200. Thus, the film forming temperature may be raised to 250° C. or more, in order to obtain the practical film forming speed. When the film forming temperature is raised to 400° C. or more or desirably 550° C. or more, HCDS can more sufficiently adsorb on the wafer 200, which makes it possible to acquire a more sufficient film forming speed.

When the film forming temperature exceeds 800° C., an excessive gas phase reaction may occur to easily degrade the thickness uniformity of the film. Therefore, it is difficult to control the thickness uniformity of the film. By adjusting the film forming temperature to 800° C. or less, a proper gas phase reaction may occur to suppress a degradation in thickness uniformity of the film. Therefore, it is possible to easily control the thickness uniformity of the film. In particular, when the film forming temperature is adjusted to 750° C. or less or desirably 700° C. or less, a surface reaction prevails more than a gas phase reaction, which makes it easy to secure the thickness uniformity of the film. Therefore, it is possible to easily control the thickness uniformity of the film.

By supplying HCDS gas to the wafer 200 according to the above-described condition, a layer #1 (initial layer) is formed on the top surface of the wafer 200. The layer #1 (initial layer) is a silicon-containing layer containing chlorine, which has a thickness of one atomic layer to several atomic layers (one molecular layer to several molecular layers), for example. The silicon-containing layer containing chlorine may indicate a silicon layer containing chlorine, an adsorption layer of HCDS, or both of them.

The silicon layer containing chlorine may include not only a continuous layer which is mainly constituted by silicon and contains chlorine, but also a discontinuous layer and a silicon thin film containing chlorine, in which the continuous layer and the discontinuous layer overlap each other. Silicon constituting the silicon layer containing chlorine includes not only silicon which is not completely separated from chlorine, but also silicon which is completely separated from chlorine.

The adsorption layer of HCDS may include not only a continuous adsorption layer constituted by HCDS molecules, but also a discontinuous adsorption layer. The HCDS molecules constituting the adsorption layer of HCDS may include HCDS molecules in which bonds between silicon and chlorine are partly separated. That is, the adsorption layer of HCDS may include a physical adsorption layer of HCDS, a chemical adsorption layer of HCDS or both of them.

In this specification, "layer having thickness of less than one atomic layer (molecular layer)" indicates an atomic layer (molecular layer) which is discontinuously formed, and "layer having thickness of one atomic layer (molecular layer)" indicates an atomic layer (molecular layer) which is continuously formed. The silicon-containing layer containing chlorine may indicate a silicon layer containing chlorine, an adsorption layer of HCDS, or both of them. For convenience of description, however, expressions such as "one atomic layer" and "several atomic layers" may be used for the silicon-containing layer containing chlorine. At this time, "atomic layer" and "molecular layer" may be used as substantially the same meaning.

Under a condition where HCDS gas self-decomposes (thermally decomposes), the silicon layer containing chlorine is formed by a deposition of silicon on the wafer 200. Under a condition where HCDS gas does not self-decompose (thermally decompose), an adsorption layer of HCDS is formed by an adsorption of HCDS on the wafer 200. When the silicon layer containing chlorine is formed on the wafer 200, the deposition rate can be raised more than when the adsorption layer of HCDS is formed on the wafer 200. Hereafter, the silicon-containing layer containing chlorine will be simply referred to as a silicon-containing layer, for convenience of description.

When the layer #1 exceeds a thickness of several atomic layers, modifications of the steps 2a, 2b and 3 described later are not transferred to the entire part of the layer #1. The thickness of the layer #1 has a minimum value of less than one atomic layer. Therefore, the thickness of the layer #1 ranges from one atomic layer to several atomic layers. By adjusting the thickness of the layer #1 to one atomic layer or less, that is, a thickness equal to or less than one atomic layer, the modifications of the steps 2a, 2b and 3 described later can be improved, and the time required for the modifications of the steps 2a, 2b and 3 can be shortened. Furthermore, the time required for forming the layer #1 at the step 1 can be shortened. As a result, the processing time per cycle can be shortened, and the total processing time can be shortened. In other words, the deposition rate can be raised. By adjusting the thickness of the layer #1 to a thickness equal to or less than one atomic layer, the thickness uniformity of the film can be more easily controlled.

After the layer #1 is formed, the valve 243a is closed to stop the supply of HCDS gas. With the APC valve 244 open, the vacuum pump 246 vacuum-exhausts the process chamber 201, and thus removes residual HCDS gas which did not react or contributed to forming the layer #1, from the process chamber 201. At this time, the valves 243d and 243e are opened to continuously supply $N_2$ gas into the process chamber 201. The $N_2$ gas serves as a purge gas.

[Steps 2a and 2b]

After the step 1 is ended, the step 2a is started to supply TEA gas to the wafer 200 in the process chamber 201, that is, the layer #1 formed on the wafer 200. The step 2a is started before the step 2b described later.

At the step 2a, the valves 243b, 243d and 243e are opened/closed in substantially the same sequence as the valves 243a, 243d and 243e at the step 1. While the flow rate of the TEA gas is adjusted by the MFC 241b, the TEA gas is supplied into the process chamber 201 through the nozzle 249b, and exhausted through the exhaust pipe 231. In this way, the TEA gas is supplied to the wafer 200.

The flow rate of the supplied TEA gas may range from 200 sccm to 10,000 sccm. The supply duration of the TEA gas may range from 2 seconds to 120 seconds, or desirably from 2 seconds to 60 seconds. The inner pressure of the process chamber 201 may range from 1 Pa to 5,000 Pa, or desirably from 1 Pa to 4,000 Pa. When the inner pressure of the process chamber 201 is such a relatively high pressure, the TEA gas may be thermally activated in a non-plasma atmosphere. When the TEA gas is thermally activated and supplied, a relatively soft chemical reaction may occur. Therefore, a layer #2a described later may be easily formed. The other processing conditions are substantially the same as the processing conditions of the step 1, for example.

When the TEA gas is supplied to the wafer 200 under the above-described conditions, the TEA gas may react with the layer #1 formed on the wafer 200 at the step 1. Then, while at least a part of the plurality of chlorine elements contained in the layer #1 is separated from the layer #1, at least a portion of a plurality of ethyl groups contained in the TEA gas may be separated from the TEA gas. The TEA gas with at least a portion of the ethyl groups separated may be bonded to silicon contained in the layer #1, thereby forming a Si—N bond. Furthermore, carbon contained in the ethyl group separated from the TEA gas may be bonded to silicon contained in the layer #1, thereby forming a Si—C bond. As a result, chlorine is desorbed from the layer #1, and the layer #1 is newly filled with carbon and nitrogen elements. As the layer #1 is modified, a layer containing silicon, carbon and nitrogen, that is, a silicon carbonitride (SiCN) layer is formed as a layer #2a on the wafer 200.

During the modifying reaction of the layer #1 by TEA gas when the layer 2a # is formed, chlorine contained in the layer #1 or hydrogen contained in the TEA gas forms a gases substance containing at least one of chlorine and hydrogen, and is discharged from the process chamber 201 through the exhaust pipe 231. That is, impurities such as chlorine in the layer #1 are separated from the layer #1 while being extracted and desorbed from the layer #1. Then, the layer #2a becomes a layer which contains a smaller amount of impurities such as chlorine than the layer #1.

While the above-described reaction is performed for a predetermined time, the step 2b of supplying $NH_3$ gas to the wafer 200 starts with the TEA gas continuously supplied to the wafer. That is, the step 2a of supplying TEA gas to the wafer 200 and the step 2b of supplying $NH_3$ gas to the wafer 200 are simultaneously performed.

At the step 2b, the valve 243c is opened with the valves 243b, 243d and 243e open. While the flow rate of $NH_3$ gas is adjusted by the MFC 241c, the $NH_3$ gas is supplied into the process chamber 201 through the gas supply pipe 232b and the nozzle 249b, and exhausted through the exhaust pipe 231. In this way, the $NH_3$ gas is supplied to the wafer 200 with TEA gas.

At the step 2b, the amount of $NH_3$ gas supplied to the wafer 200 is smaller than the amount of TEA gas supplied to the wafer 200 at the step 2a.

For example, by adjusting the supply duration of $NH_3$ gas at the step 2b to a shorter duration than the supply duration of TEA gas at the step 2a, the amount of $NH_3$ gas supplied to the wafer 200 may be controlled as described above. The supply duration of $NH_3$ gas may range from 1 second to 30 seconds, desirably from 1 second to 20 seconds, or more desirably from 1 second to 10 seconds.

For example, by adjusting the flow rate of $NH_3$ gas supplied at the step 2b to a lower flow rate than the flow rate of TEA gas supplied at the step 2a, the amount of $NH_3$ gas supplied to the wafer 200 may be controlled as described above. The flow rate of the supplied $NH_3$ gas may range from 100 sccm to 1,000 sccm or desirably from 100 sccm to 500 sccm.

FIG. 4A illustrates an example in which the supply duration of $NH_3$ gas at the step 2b is shorter than the supply duration of TEA gas at the step 2a, and the flow rate of $NH_3$ gas supplied at the step 2b is lower than the flow rate supplied at the step 2a.

The other processing conditions are substantially the same as the processing conditions of the step 2a before the step 2b is started, for example.

By supplying TEA gas and $NH_3$ gas to the wafer 200 according to the above-described conditions, at least a portion of the layer #2a may be modified (nitrogen or carbon may be added). That is, at least a part of nitrogen contained in the $NH_3$ gas may be added to the layer #2a, thereby generating a Si—N bond in the layer #2a. Furthermore, at least a portion of carbon or nitrogen contained in the TEA gas may be added to the layer #2a, thereby generating a Si—C bond or Si—N bond in the layer #2a. As the layer #2a is modified, a layer containing a larger amount of nitrogen than the layer #2a, that is, a SiCN layer nitrogen-richer than the layer #2a is formed as a layer #2b on the wafer 200. The layer #2b may be a layer containing a larger amount of carbon than the layer #2a, that is, a SiCN layer nitrogen-richer and carbon-richer than the layer #2a.

During the modifying reaction of the layer #2a by TEA gas or $NH_3$ gas when the layer #2b is formed, chlorine contained in the layer #2a or hydrogen contained in the TEA gas and $NH_3$ gas forms a gaseous substance containing at least one of chlorine and hydrogen, and is discharged from the process chamber 201 through the exhaust pipe 231. That is, impurities such as chlorine of the layer #2a are separated from the layer #2a. Thus, the layer #2b becomes a layer with a smaller amount of impurities such as chlorine than the layer #2a.

After the layer #2b is formed, the valves 243b and 243c are closed to stop the supply of TEA gas and the supply of $NH_3$ gas at the same time. According to substantially the same processing sequence as the step 1, residual TEA gas, $NH_3$ gas or reaction byproducts which did not react or contributed to forming the layer #2b may be removed from the process chamber 201.

[Step 3]

After the steps 2a and 2b are ended, $O_2$ gas is supplied to the wafer 200 in the process chamber 201, that is, the layer #2b formed on the wafer 200.

At the step 3, the valves 243b, 243d and 243e are opened/closed in substantially the same sequence as the valves 243a, 243d and 243e at the step 1. While the flow rate of $O_2$ gas is adjusted by the WC 241b, the $O_2$ gas is supplied into the process chamber 201 through the nozzle 249b, and exhausted through the exhaust pipe 231. In this way, the $O_2$ gas is supplied to the wafer 200.

The flow rate of the supplied $O_2$ gas may range from 100 sccm to 10,000 sccm. The supply duration of the $O_2$ gas may range from 1 second to 120 seconds, or desirably from 1 second to 60 seconds. The inner pressure of the process chamber 201 may range from 1 Pa to 4,000 Pa, or desirably from 1 Pa to 3,000 Pa. The partial pressure of the $O_2$ gas may range from 0.01 Pa to 3,960 Pa. When the inner pressure of the process chamber 201 is such a relatively high pressure, the $O_2$ gas may be thermally activated in a non-plasma state. When the $O_2$ gas is thermally activated and supplied, a relatively soft chemical reaction may occur. Thus, a layer #3 described later may be easily formed. The other processing conditions are substantially the same as the processing conditions of the step 1, for example.

By supplying the $O_2$ gas to the wafer 200 according to the above-described conditions, at least a portion of the layer #2b may be modified (oxidized). That is, at least a portion of oxygen contained in the $O_2$ gas may be added to the layer 2b, thereby forming a Si—O bond in the layer #2b. As the layer #2b is modified, a layer containing silicon, oxygen, carbon and nitrogen, that is, a silicon oxycarbonitride (SiOCN) film is formed as a third layer on the wafer 200. When the layer #3 is formed, at least a portion of carbon or nitrogen contained in the layer #2b is not desorbed from the layer #2b, but remains in the layer #2b.

When the third layer is formed, chlorine contained in the layer #2b forms a gaseous substance containing at least chlorine during the modifying reaction by the $O_2$ gas, and is discharged from the process chamber 201. That is, impurities such as chlorine of the layer #2b are separated from the layer #2b while being extracted or desorbed from the layer #2b. Then, the layer #3 becomes a layer with a smaller amount of impurities such as chlorine than the layer #2b.

After the layer #3 is formed, the valve 243b is closed to stop the supply of $O_2$ gas. According to substantially the same processing sequence as the step 1, residual $O_2$ gas or reaction byproducts which did not react or contributed to forming the layer #3 in the process chamber 201 may be removed from the process chamber 201.

Performing Predetermined Number of Times

By performing a first cycle one or more times (n1 times), a SiOCN film having a predetermined composition and thickness is formed as the layer #1 on the wafer 200, the first cycle including the steps 1, 2a, 2b and 3 which are performed according to the above-described timings. Desirably, the above-described first cycle may be repeated a plurality of times. That is, the thickness of the layer #3 formed per cycle is set to a smaller thickness than the thickness of a desired film, and the above-described first cycle may be performed a plurality of times until the thickness of SiOCN film formed by stacking the layer #3 becomes the thickness of the desired film. The first film has a thickness of 5 nm to 500 nm, which is larger than the thickness of the second film described later.

Since the SiOCN film formed at the first film forming step contains carbon, the SiOCN film has high etching resistance. The nitrogen concentration of the SiOCN film formed at the first film forming step is lower than the carbon concentration of the SiOCN film and lower than the silicon and oxygen concentrations of the SiOCN film. By adjusting the amount of nitrogen to a relatively small amount, the relative dielectric constant (k value) of the film may be lowered. Therefore, the SiOCN film may be used as a low-k film.

Second Film Forming Step

After the first film is formed, a second cycle including steps C1, C2a, C2b and C3 is performed. The processing sequence and conditions of the steps C1, C2a, C2b and C3 are substantially the same as the processing sequence and conditions as the steps 1, 2a, 2b and 3, except that the amount of $O_2$ gas supplied per cycle at the second film forming step is smaller than the amount of $O_2$ gas supplied per cycle at the first film forming step.

In order to lower the amount of $O_2$ gas supplied per cycle at the second film forming step, the supply duration of $O_2$ gas per cycle at the second film forming step, that is, the duration of the step C3 may be adjusted to a shorter duration than the supply duration of $O_2$ gas per cycle at the first film forming step, that is, the duration of the step 3. The supply duration of $O_2$ gas per cycle at the second film forming step may range from 1 second to 60 seconds or desirably from 1 second to 30 seconds.

By performing the steps C1, C2a, C2b and C3 according to the above-described processing conditions, substantially the same layers as the layers #1, #2a, #2b and #3 formed at the first film forming step may be sequentially formed on the first film. By performing the second cycle one or more times (n2 times), a SiOCN film having a predetermined composition and thickness may be formed as a second film on the top surface of the first film.

At the step C3, the oxidation of the layer #2b can be more properly suppressed than in the step 3, because the amount of supplied $O_2$ gas is lowered as described above. That is, the amount of oxygen added to the layer #2b at the step C3 can be lowered to a smaller amount than in the step C3, or a desorption of carbon or nitrogen from the layer #2b can be suppressed. As a result, the second film becomes a layer which has a lower oxygen concentration and higher nitrogen and carbon concentrations than the first film. In other words, the second film becomes an oxygen-poor, carbon-rich and nitrogen-rich SiOCN film. That is, the oxygen concentration of the second film is lower than the oxygen concentration of the first film, the nitrogen concentration of the second film is higher than the nitrogen concentration of the first film, and the carbon concentration of the second film is higher than the carbon concentration of the first film.

As the second film has such a composition, the second film becomes a film which has higher oxygen resistance (ashing resistance) and higher resistance (etching resistance) to a substance such as hydrogen fluoride (HF) than the first film. Since the second film is formed on the top surface of the first film, the second film functions as a film for protecting the surface of the first film serving as the base film, that is, a capping (passivation) film.

At the second film forming step, the above-described second cycle may be repeated a plurality of times. However, the second film has a thickness of 1 nm to 2 nm, which is smaller than the thickness of the first film. When the thickness of the second film is less than 1 nm, the second film may not be used as a capping film. When the thickness of the second film exceeds 2 nm, the dielectric constant of the stacked film including the first and second films may increase. In this case, the stacked film may not be used as a low-k film.

Additional Purge Step and Atmospheric Pressure Return Step

When the second film forming step is ended, $N_2$ gas is supplied into the process chamber 201 through the gas supply pipes 232d and 232d, and exhausted through the exhaust pipe 231. The $N_2$ gas serves as a purge gas. Thus, while the inside of the process chamber 201 is purged, gases or reaction byproducts remaining in the process chamber 201 are removed from the process chamber 201 (additional purge). Then, the inner atmosphere of the process chamber 201 is substituted with inert gas (inert gas substitution), and the inner pressure of the process chamber 201 returns to normal pressure (atmospheric pressure return).

Boat Unloading and Wafer Discharging

Then, as the seal cap 219 is moved downward by the boat elevator 115, the lower end of the manifold 209 is opened, and the processed wafer 200 is unloaded to the outside of the reaction tube 203 through the lower end of the manifold 209 while being supported by the boat 217 (boat unloading). After boat unloading, the shutter 219s is moved, and the lower end opening of the manifold 209 is sealed by the shutter 219s through the O-ring 220c (shutter closing). The processed wafer 200 is loaded to the outside of the reaction tube 203, and then discharged from the boat 217 (wafer discharging).

(3) Effects According to the Present Embodiment

According to the present embodiment, one or more effects described below can be obtained.

(a) As the second film having a lower oxygen concentration and smaller thickness than the first film is formed on the top surface of the first film, it is possible to obtain the stacked film of the first and second films, which has excellent ashing resistance while having a low dielectric constant and high etching resistance.

Since the first film formed at the first film forming step has a relatively small amount of nitrogen therein, the first film has a low dielectric constant. Since the first film contains carbon, the first film has high etching resistance. According to the earnest research of the inventor of the present application, however, the first film has low ashing resistance because the first film contains a relatively large amount of oxygen and a relatively small amount of nitrogen. According to the earnest research of the inventor of the present application, when the amount of oxygen contained in the first film is lowered or the amount of nitrogen contained in the first film is raised, the ashing resistance of the first film is increased, but the low dielectric constant or high etching resistance of the first film cannot be maintained. That is, when only the first film forming step is performed, it is difficult to maintain the balance of the characteristics (low dielectric constant, high etching resistance and high ashing resistance) which have a trade-off relation.

On the contrary, the second film formed at the second film forming step has a lower oxygen concentration and higher nitrogen and carbon concentrations than the first film. Due to such a composition, the second film has higher ashing resistance than the first film. Therefore, the second film may be formed on the top surface of the first film, thereby compensating for the insufficient ashing resistance of the first film. That is, the stacked film of the first and second films may have high ashing resistance at the surface thereof. Due to the above-described composition, the second film has etching resistance equal to or higher than the first film. Therefore, by forming the second film on the top surface of the first film, it is possible to maintain or strengthen the etching resistance at the surface of the stacked film of the first and second films. By adjusting the thickness of the second film to a smaller thickness than the first film, it is possible to suppress an increase in dielectric constant in the entire stacked film of the first and second films. That is, when the thickness of the second film is properly adjusted to a small thickness, the stacked film of the first and second films may be used as a low-k film.

Since the second film is formed on the top surface of the first film, the second film functions as a film for protecting the surface of the first film serving as the base film, that is, a capping (passivation) film. According to the present embodiment, when the films are formed on the wafer 200, the balance of low dielectric constant, high etching resistance and high ashing resistance which have a trade-off relation may be properly maintained.

(b) The amount of $NH_3$ gas supplied per cycle at each of the first and second film forming steps may be set to a smaller amount than the amount of TEA gas, which makes it possible to properly increase the carbon concentration of the film (first and second films) formed on the wafer 200 while suppressing an excessive addition of nitrogen to the film. Therefore, when the film is formed on the wafer 200, the balance of low dielectric constant, high etching resistance and high ashing resistance which have a trade-off relation can be more properly maintained.

(c) By supplying TEA gas before $NH_3$ gas at each cycle of the first and second film forming steps, it is possible to suppress an excessive addition of nitrogen to the film (the first and second films) formed on the wafer 200 while properly increasing the carbon concentration of the films, compared to when $NH_3$ gas is supplied before TEA gas or the supply of $NH_3$ gas and the supply of TEA gas are started at the same time. Therefore, when the film is formed on the wafer 200, the balance of low dielectric constant, high etching resistance and high ashing resistance which have a trade-off relation can be more properly maintained.

(d) By using a combination of TEA gas and $NH_3$ gas with high reactivity at each cycle of the first and second film forming steps, the layer formed on the wafer 200 is uniformly modified as a whole. Therefore, the thickness uniformity or quality uniformity at the surface of the film (first and second films) formed on the wafer 200 can be improved. Since the layer formed on the wafer 200 can be efficiently modified, the productivity of the film forming process can be improved. Furthermore, since impurities can be effectively desorbed from the layer formed on the wafer 200, the impurity concentration of the film formed on the wafer 200 may be lowered.

(e) Since the step of supplying $NH_3$ gas at each cycle of the first and second film forming steps is performed while the step of supplying TEA gas is performed, the time required per cycle can be shortened, and the productivity of the substrate processing can be improved.

(f) Since the steps 1, 2a and 3 are non-simultaneously performed at the first film forming step, the step coverage or thickness controllability of the film formed on the wafer 200 can be improved more than when at least one of the steps 1, 2a and 3 are simultaneously performed. Since the steps C1, C2a and C3 are also performed non-simultaneously at the second film forming step, substantially the same effect can be obtained.

(g) The kinds of gases used in the first and second film forming steps may be commonized, and the gases may be supplied in simultaneously the same sequence. Such a configuration can prevent a complex gas supply system or complex gas supply sequence, and avoid an increase of the film forming cost.

(h) The same effects as the above-described effects can be obtained when another source gas is used instead of HCDS gas, a gas containing carbon and nitrogen is used instead of TEA gas, a nitriding gas is used instead of $NH_3$ gas, or an oxidizing gas is used instead of $O_2$ gas, in at least one of the first and second film forming steps.

For example, halosilane-based gases such as monochlorosilane ($SiH_3Cl$, abbreviated to MCS) gas, dichlorosilane ($SiH_2Cl_2$, abbreviated to DCS) gas, trichlorosilane ($SiHCl_3$, abbreviated to TCS) gas, tetrachlorosilane ($SiCl_4$, abbreviated to STC) gas and octachlorosilane ($Si_3Cl_8$, abbreviated to OCTS) gas may be used as the source gas.

For example, an alkylene halogen-based gas such as 1,2-bis((trichlorosilyl)ethane (($SiCl_3)_2C_2H_2$, abbreviated to BTCSE) gas and bis(trichlorosilyl)methane (($SiCl_3)_2CH_2$, abbreviated to BTCSM) gas and an alkyl halosilane-based gas such as 1,1,2,2-tetrachloro-1,2-dimethyldisliane (($CH_3)_2Si_2Cl_4$, abbreviated to TCDMDS) gas and 1,2-dichloro-1,1,2,2-tetramethyldisilane (($CH_3)_4Si_2Cl_2$, abbreviated to DCTMDS) gas may be used as the source gas. All of the gases are source gases containing a Si—C bond.

For example, hydrogenated silicon gases such as monosilane ($SiH_4$, abbreviated to MS) gas, disilane ($Si_2H_6$, abbreviated to DS) gas and trisilane ($Si_3H_8$, abbreviated to TS) gas may be used as the source gas.

For example, aminosilane-based gases such as tetrakis (dimethylamino)silane ($Si[N(CH_3)_2]_4$, abbreviated to 4DMAS) gas, tris(dimethylamino)silane ($Si[N(CH_3)_2]_3H$, abbreviated to 3DMAS) gas, bis(diethylamino)silane ($Si[N(C_2H_5)_2]_2H_2$, abbreviated to BDEAS) gas, bis(tertiary-butylamino)silane ($SiH_2[NH(C_4H_9)]_2$, abbreviated to BTBAS) gas, and diisopropylamino silane ($SiH_3N[CH(CH_3)_2]_2$, abbreviated to DIPAS) gas may be used as the source gas. All of the gases are source gases containing a Si—C bond.

For example, an ethylamine-based gas such as diethylamine (($C_2H_5)_2NH$, abbreviated to DEA) gas and monoethylamine ($C_2H_5NH_2$, abbreviated to MEA) gas, a methylamine-based gas such as trimethylamine (($CH_3)_3N$, abbreviated to TMA) gas, dimethylamine (($CH_3)_2NH$, abbreviated to DMA) gas and monomethylamine ($CH_3NH_2$, abbreviated to MMA) gas, a propylamine-based gas such as a tripropylamine (($C_3H_7)_3N$, abbreviated to TPA) gas, dipropylamine (($C_3H_7)_2NH$, abbreviated to DPA) gas and monopropylamine ($C_3H_7NH_2$, abbreviated to MPA) gas, an isopropylamine-based gas such as triisopropylamine ($[(CH_3)_2CH]_3N$, abbreviated to TWA) gas, diisopropylamine ($[(CH_3)_2CH]_2NH$, abbreviated to DIPA) gas and monoisopropylamine (($CH_3)_2CHNH_2$, abbreviated to MIPA) gas, a butylamine-based gas such as tributylamine (($C_4H_9)_3N$, abbreviated to TBA) gas, dibutylamine (($C_4H_9)_2NH$, abbreviated to DBA) gas and monobutylamine ($C_4H_9NH_2$, abbreviated to MBA) gas, and an isobutylamine-based gas such as triisobutylamine ($[(CH_3)_2CHCH_2]_3N$, abbreviated to TIBA) gas, diisobutylamine ($[(CH_3)_2CHCH_2]_2NH$, abbreviated to DIBA) gas and monoisobutylamine (($CH_3)_2CHCH_2NH_2$, abbreviated to MIBA) gas may be used as the gas containing carbon and nitrogen.

For example, an organic hydrazine-based gas may be used as the gas containing carbon and nitrogen. The organic hydrazine-based gas may include a methylhydrazine-based gas such as monomethylhydrazine (($CH_3)HN_2H_2$, abbreviated to MMH) gas, dimethylehydrazine (($CH_3)_2N_2H_2$, abbreviated to DMH) gas and trimethylhydrazine (($CH_3)_2N_2(CH_3)H$, abbreviated to TMH) gas and an ethylhydrazine-based gas such as ethylhydrazine (($C_2H_5)HN_2H_2$, abbreviated to EH) gas.

For example, a hydronitrogen-based gas such as diazen ($N_2H_2$) gas, hydrazine ($N_2H_4$) gas and $N_3H_8$ gas or a gas containing a compound thereof may be used as the nitriding gas.

For example, gases such as steam ($H_2O$ gas), carbon monoxide (NO) gas, nitrous oxide ($N_2O$) gas, nitrogen dioxide ($NO_2$) gas, carbon monoxide (CO) gas, carbon dioxide ($CO_2$) gas, ozone ($O_3$) gas, a gas mixture of $H_2$ gas and $O_2$ gas and a gas mixture of $H_2$ gas and $O_3$ gas may be used the oxidizing gas.

In addition to $N_2$ gas, rare gases such as argon (Ar) gas, helium (He) gas, neon (Ne) gas and xenon (Xe) gas may be used as the inert gas.

(4) Modifications

The sequence of the film forming process according to the present embodiment is not limited to the example illustrated in FIG. 4A, but may be modified as follows.

First Modification

The film forming sequence illustrated in FIG. 4A has exemplified that the supply duration of $O_2$ gas at the step C3 is shorter than that of the step 3. However, at least one of the flow rate, partial pressure and concentration of $O_2$ gas supplied at the step C3 may be lower than those of the step 3.

In this case, the flow rate of $O_2$ gas supplied at the step C3 may range from 1 sccm to 5,000 sccm. The partial pressure of $O_2$ gas at the step C3 may range from 0.01 Pa to 1,980 Pa. The concentration of $O_2$ gas in the inner atmosphere of the process chamber 201 at the step C3 may range from 1% to 50% or desirably from 1% to 30%.

According to the first modification, the amount of $O_2$ gas supplied per cycle at the second film forming step can be adjusted to a smaller amount than the amount of $O_2$ gas supplied per cycle at the first film forming step, and the oxidation of the layer #2b at the step C3 can be properly suppressed. Therefore, the first modification can provide substantially the same effect as the film forming step illustrated in FIG. 4A.

Second Modification

A substance which has a different molecular structure (chemical structure) from the oxygen-containing gas supplied at the first film forming step and has a lower oxidative power than the oxygen-containing gas supplied at the first filming step may be used as the oxygen-containing gas supplied at the second film forming step. For example, according to a film forming sequence expressed below, $O_2$ gas may be supplied as the oxygen-containing gas at the first forming step, and a nitric oxide-based gas such as NO gas having a lower oxidative power than $O_2$ gas may be supplied as the oxygen-containing gas at the second film forming step. In addition to NO gas, a gas such as $N_2O$ gas and $NO_2$ gas may be supplied as the nitric oxide-based gas.

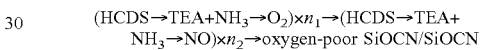

(HCDS→TEA+$NH_3$→$O_2$)×$n_1$→(HCDS→TEA+$NH_3$→NO)×$n_2$→oxygen-poor SiOCN/SiOCN According to the second modification, the oxidation of the layer #2b at the step C3 can be properly suppressed. Therefore, the second modification may have substantially the same effect as the first modification.

Third Modification

According to a film forming sequence illustrated in FIG. 4B or expressed below, the second cycle may be performed one or more times ($n_2$ times) at the second film forming step, the second cycle including the step C1 of supplying HCDS gas to the wafer 200, the step C2a of supplying TEA gas to the wafer 200 and the step C2b of supplying $NH_3$ gas to the wafer 200. That is, in the third modification, the step C3 of supplying $O_2$ gas to the wafer 200 is not performed at the second film forming step. The processing conditions of the third modification may be substantially the same as the processing conditions of the film forming sequence illustrated in FIG. 4A. According to the third modification, a film having a smaller thickness and lower oxygen concentration than the first film or specifically a silicon nitrocarbide film having an oxygen concentration of zero (SiCN film free of oxygen) is formed as the second film. In the third modification, the nitrogen concentration of the second film is higher than the nitrogen concentration of the first film, and the carbon concentration of the second film is higher than the carbon concentration of the first film.

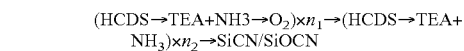

(HCDS→TEA+NH3→$O_2$)×$n_1$→(HCDS→TEA+$NH_3$)×$n_2$→SiCN/SiOCN

The etching resistance and ashing resistance of the second film which is formed according to the third modification are higher than the etching resistance and ashing resistance of the second film which is formed according to the film forming sequence illustrated in FIG. 4A. That is, according to the third modification, the etching resistance and ashing resistance among the three characteristics (low dielectric constant, high etching resistance and high ashing resistance)

which have a trade-off relation can be selectively strengthened, while the balance of the three characteristics is properly maintained.

Fourth Modification

According to a film forming sequence illustrated in FIG. 4C or expressed below, the second cycle may be performed one or more times ($n_2$ times) at the second film forming step, the second cycle including the step C1 of supplying HCDS gas to the wafer 200 and the step C2b of supplying $NH_3$ gas to the wafer 200. That is, in the fourth modification, the step C2a of supplying TEA gas to the wafer 200 and the step C3 of supplying $O_2$ gas to the wafer 200 are not performed at the second film forming step. The flow rate of $NH_3$ gas supplied at the step C2b in the fourth modification ranges from 2,000 sccm to 10,000 sccm or desirably from 2,000 sccm to 6,000 sccm, and is higher than the flow rate of $NH_3$ gas supplied at the step C2b in the film forming sequence of FIG. 4A. The supply duration of $NH_3$ gas at the step C2b in the fourth modification ranges from 2 seconds to 120 seconds or desirably from 2 second to 60 seconds, and is longer than the supply duration of $NH_3$ gas at the step C2b in the film forming sequence of FIG. 4A. The other processing conditions are substantially the same as the processing conditions of the film forming sequence illustrated in FIG. 4A. According to the fourth modification, a film having a smaller thickness and lower oxygen and carbon concentrations than the first film or specifically a silicon nitride film having oxygen and carbon concentrations of zero (SiN film free of oxygen and carbon) is formed as the second film. According to the fourth modification, the nitrogen concentration of the second film is higher than the nitrogen concentration of the first film.

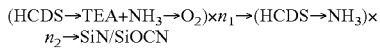

The ashing resistance of the second film which is formed according to the fourth modification is higher than the ashing resistance of the second film which is formed according to the film forming sequence illustrated in FIG. 4A. That is, according to the fourth modification, the ashing resistance among the three characteristics (low dielectric constant, high etching resistance and high ashing resistance) which have a trade-off relation can be selectively strengthened, while the balance of the three characteristics is properly maintained.

Fifth Modification

According to film forming sequences expressed below, a step of supplying $NH_3$ gas is not performed in at least one of the first and second film forming steps.

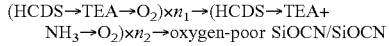

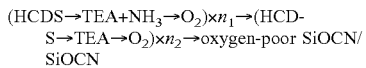

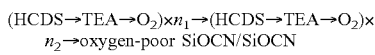

In at least one of the first and second film forming steps, the timing at which the step of supplying $NH_3$ gas is performed may be arbitrarily changed as follows.

For example, the step of supplying TEA gas may be started before the step of supplying $NH_3$ gas, and the steps may be performed non-simultaneously. For example, the step of supplying TEA gas may be started before the step of supplying $NH_3$ gas, and the time period in which the steps are simultaneously performed may be included in the film forming step. For example, the step of supplying TEA gas may be started at the same time as the step of supplying $NH_3$ gas. In this case, the step of supplying $NH_3$ gas may be ended before the step of supplying TEA gas is ended. For example, the step of supplying $NH_3$ gas may be started before the step of supplying TEA gas, and the time period in which the steps are simultaneously performed may be included in the film forming step. In this case, the step of supplying $NH_3$ gas may be ended before the step of supplying TEA gas is ended. For example, the step of supplying $NH_3$ gas may be started before the step of supplying TEA gas, and the steps may be performed non-simultaneously. For example, the step of supplying $NH_3$ gas may be intermittently performed a plurality of times, and the step of supplying TEA gas may be intermittently performed a plurality of times.

According to the fifth modification, the carbon concentration or nitrogen concentration of the film (first and second films) formed on the wafer 200 may be controlled in a wide range.

Sixth Modification

In at least one of the first and second film forming steps as expressed below, an alkylhalosilane-based gas containing a Si—C bond and serving as a carbon source, such as TCDMDS gas, may be used as the source gas, instead of a halosilane-based gas free of carbon. In this case, according to the film forming sequence expressed below, TEA gas serving as a carbon source is not supplied. The other processing conditions of the sixth modification may be substantially the same as the processing conditions of the film forming sequence illustrated in FIG. 4A.

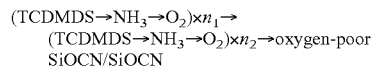

The sixth modification has substantially the same effect as the film-forming sequence of FIG. 4A. According to the sixth modification, since the nitrogen concentration of the first film may be lower than the carbon concentration of the first film, the first film contains a relatively small amount of nitrogen. In this case, the second film formed as a capping film on the top surface of the first film plays a meaningful role. When TEA gas serving as a carbon source is supplied according to film forming sequences expressed below, the same effect as the film forming sequence of FIG. 4A may also be obtained.

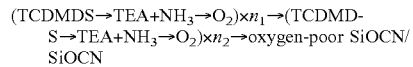

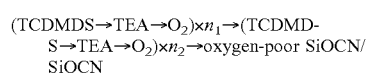

Seventh Modification

According to film forming sequences expressed below, a carbon source (carbon containing gas) such as propylene ($C_3H_6$) gas, serving as a hydrocarbon-based gas, may be used at the second film forming step. The $C_3H_6$ gas is supplied through the gas supply pipe 232b, for example, and the flow rate of the supplied $C_3H_6$ gas ranges from 100 sccm to 10,000 sccm. The other processing conditions of the seventh modification are substantially the same as the film forming sequence illustrated in FIG. 4A or the above-described modifications.

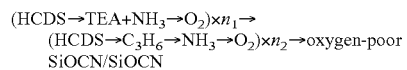

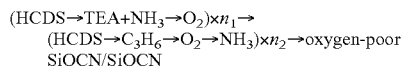

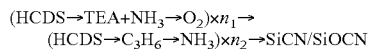

The seventh modification has substantially the same effect as the film-forming sequence of FIG. 4A or the above-described modifications. However, the film forming sequence of FIG. 4A, which can commonize the types of gases used through the first and second film steps and set the supply sequences to substantially the same supply sequence, is more desirable than the seventh modification, because the film forming sequence of FIG. 4A can avoid the increase of the film forming cost while preventing the complexity of the gas supply system or the gas supply sequence.

Eighth Modification

According to film forming sequences expressed below, a carbon source such as $C_3H_6$ may be used to form a film at the first film forming step. The eighth modification may have substantially the same processing conditions as those described in the seventh modification.

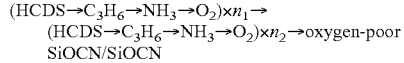

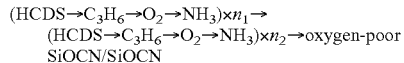

The amount of nitrogen contained in the first films formed by the film forming sequences and the dielectric constants thereof may be more easily increased than the first film formed by the film forming sequence illustrated in FIG. 4A. Thus, in order to use the films formed by the film forming sequences as a low-k film, the duration of the step 3 of supplying $O_2$ gas to the wafer 200 needs to be increased, thereby sufficiently lowering the nitrogen and carbon concentrations of the first film. In this case, however, the ashing resistance of the first film may be degraded. Therefore, by forming the second film as a capping layer on the top surface of the first film in substantially the same manner as FIG. 4A or the other modifications, the ashing resistance may be strengthened.

Other Embodiments

So far, the various embodiments have been described. However, the technique described above is not limited to the embodiments, but may be modified in various manners without departing from the scope of the present disclosure.

For example, the above-described embodiments or modifications have been based on the example in which a reactant is supplied after a source is supplied. However, the technique described above is not limited thereto, but the sequence of supplying the source and reactant may be changed. That is, the source may be supplied after the reactant is supplied. By changing the supply sequence, the quality or composition ratio of a formed film may be varied.

For example, the above-described embodiments or modifications have been based on the example in which a film containing silicon as a main element is formed on a substrate. However, the technique described above is not limited thereto. That is, the technique described above may also be desirably applied when a film containing a semi-metal element as a main element is formed on the substrate, the semi-metal element including germanium (Ge) and boron (B) as well as silicon. The technique described above may also be desirably applied when a film containing a metal element as a main element is formed on the substrate, the metal element including titanium (Ti), zirconium (Zr), hafnium (Hf), niobium (Nb), tantalum (Ta), molybdenum (Mo), tungsten (W), yttrium (Y), lanthanum (La), strontium (Sr) and aluminum (Al).

A recipe used for substrate processing may be separately prepared depending on the contents of the substrate processing, and stored in the memory device 121c through an electrical communication line or the external memory device 123. When the substrate processing is started, the CPU 121a may select a proper recipe among a plurality of recipes stored in the memory device 121c, depending on the contents of the substrate processing. Thus, plural kinds of thin films having various composition ratios, qualities and thicknesses can be reproducibly formed through one substrate processing apparatus. Furthermore, the burden of an operator can be reduced, and the substrate processing can be rapidly started while an operation mistake is avoided.

The above-described recipes are not limited to newly created recipes. For example, an existing recipe which is already installed in the substrate processing apparatus may be changed to a new recipe. When a recipe is to be changed, the recipe may be installed in the substrate processing apparatus through an electrical communication line or a recording medium having the recipe written therein. The I/O device 122 installed in the existing substrate processing apparatus may be operated to directly change the existing recipe which is already installed in the substrate processing apparatus.

The above-described embodiments have been based on the example in which a film is formed by a batch-type substrate processing apparatus capable of processing a plurality of substrates at a time. The technique described herein is not limited to the above-described embodiments. The technique described herein may also be desirably applied when forming a film using a single-wafer type substrate processing apparatus that processes one or more substrates at a time. The above-described embodiments have been based on the example in which a thin film is formed through the substrate processing apparatus including the hot wall-type processing furnace. The technique described herein is not limited to the above-described embodiments. The technique described herein may also be desirably applied when forming a film using a substrate processing apparatus including a cold wall-type processing furnace, for example.

Figure 6A:
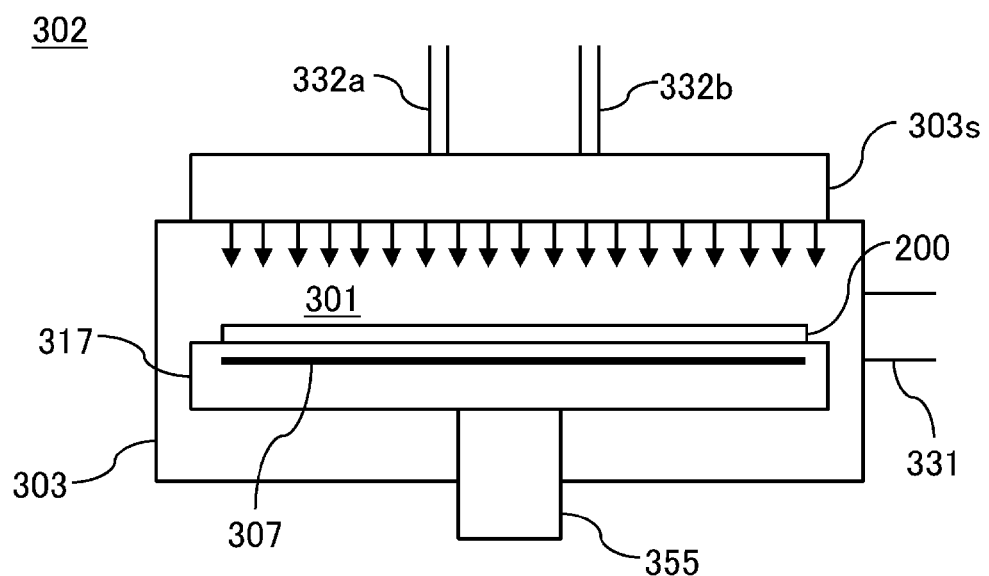
FIGS. 6A and 6B are diagrams schematically illustrating a configuration of a process furnace of a substrate processing apparatus which is used in another embodiment described herein, including a longitudinal sectional view of the process furnace.

The technique described herein may also be desirably applied when forming a film using a substrate processing apparatus having a processing furnace 302 illustrated in FIG. 6a, for example. The processing furnace 302 includes a processing vessel 303 constituting a process chamber 301; a shower head 303s serving as a gas supply unit configured to shower a gas into the process chamber 301; a support 317 configured to support one or more wafers 200 at a horizontal position; a rotating shaft 355 configured to support the support 317 from thereunder; and a heater 307 installed in the support 317. Gas supply ports 332a and 332b are connected to an inlet of the shower head 303s. A supply system having substantially the same configuration as the source supply system according to the above-described embodiment is connected to the gas supply port 332a. A supply system having substantially the same configuration as the first to third reactant supply systems according to the above-described embodiment is connected to the gas supply port 332b. A gas dispersion plate configured to shower a gas into the process chamber 301 is installed at an outlet of the shower head 303s. The shower head 303s is installed at a location facing the surface of the wafer 200 loaded into the process chamber 301. An exhaust port 331 for exhausting the process chamber 301 is installed at the processing vessel 303. An exhaust system having the substantially the same configuration as the exhaust system according to the above-described embodiment is connected to the exhaust port 331.

Figure 6B:
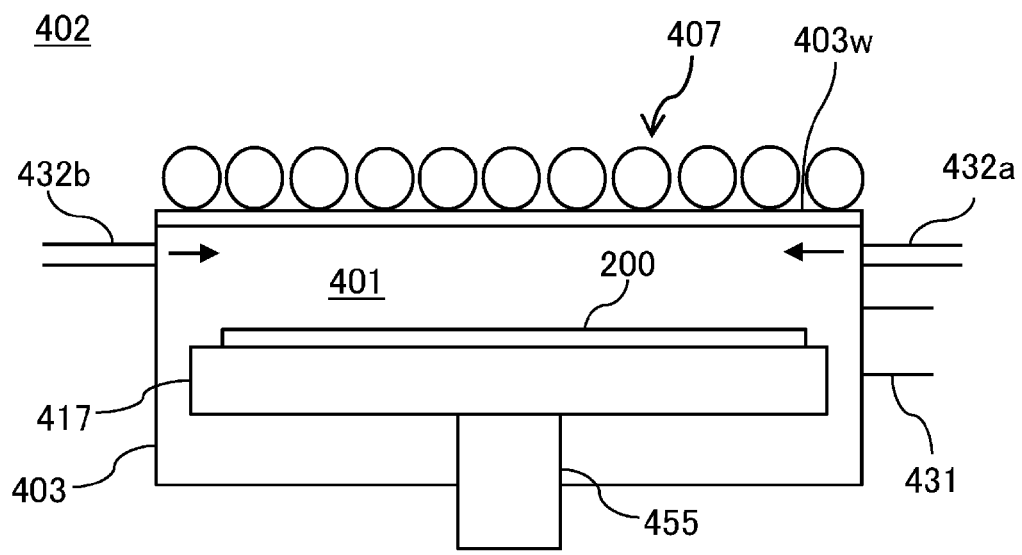

The technique described herein may also be desirably applied when forming a film using a substrate processing apparatus having a processing furnace 402 illustrated in FIG. 6b, for example. The processing furnace 402 includes a processing vessel 403 forming a process chamber 401; a support 417 configured to support one or more wafers 200 at a horizontal position; a rotating shaft 455 configured to support the support 417 from thereunder; a lamp heater 407 configured to irradiate light toward the wafers 200 in the processing container 403; and a quartz window 403w configured to transmit light of the lamp heater 407. Gas supply ports 432a and 432b are connected to the processing vessel 403. A supply system having substantially the same configuration as the source supply system according to the above-described embodiment is connected to the gas supply port 432a. A supply system having substantially the same configuration as the first to third reactant supply systems according to the above-described embodiment is connected to the gas supply port 432b. The gas supply ports 432a and 432b are installed at sides of the end of the wafer 200 loaded in the process chamber 401. The exhaust port 431 for exhausting the process chamber 401 is installed at the processing vessel 403. An exhaust system having the substantially the same configuration as the above-described exhaust system according to the above-described embodiment is connected to the exhaust port 431.

Even when those substrate processing apparatuses are used, the film forming process can be performed according to substantially the same processing sequences and conditions as the above-described embodiment or modifications, and substantially the same effect as the above-described embodiment or modifications can be obtained.

The above-described embodiment and modifications may be properly combined and used. At this time, the processing sequences and conditions are substantially the same as the processing sequence and conditions as the above-described embodiment, for example.

Experimental Example

Hereafter, experiment results supporting the effects which can be obtained by the above-described embodiment will be described.

A first sample is a SiOCN film which is formed on a wafer according to the first film forming step of the film forming sequence illustrated in FIG. 4A. A capping film by the second film forming step is not formed. The processing conditions fall in the ranges of the processing conditions of the above-described embodiment. The thickness of the SiOCN film is 70 Å.

A second sample is a stacked film formed by stacking a SiOCN film (base film) and oxygen-poor SiOCN film (capping film) on a wafer according to the film forming sequence illustrated in FIG. 4A. The base film is formed under the same processing conditions as those applied when the first sample is formed. The processing conditions applied when forming the capping film fall in the ranges of the processing conditions of the above-described embodiment. The thickness of the base film is 40 Å, the thickness of the capping film is 30 Å, and the thickness of the stacked film is 70 Å.

A third sample is a stacked film formed by stacking a SiOCN film (base film) and SiCN film (capping film) on a wafer according to the film forming sequence illustrated in FIG. 4B. The base film is formed under the same processing conditions as those applied when the first sample is formed. The processing conditions applied when forming the capping film fall in the ranges of the processing conditions of the above-described embodiment. The thickness of the base film is 50 Å, the thickness of the capping film is 20 Å, and the thickness of the stacked film is 70 Å.

Figure 4C:
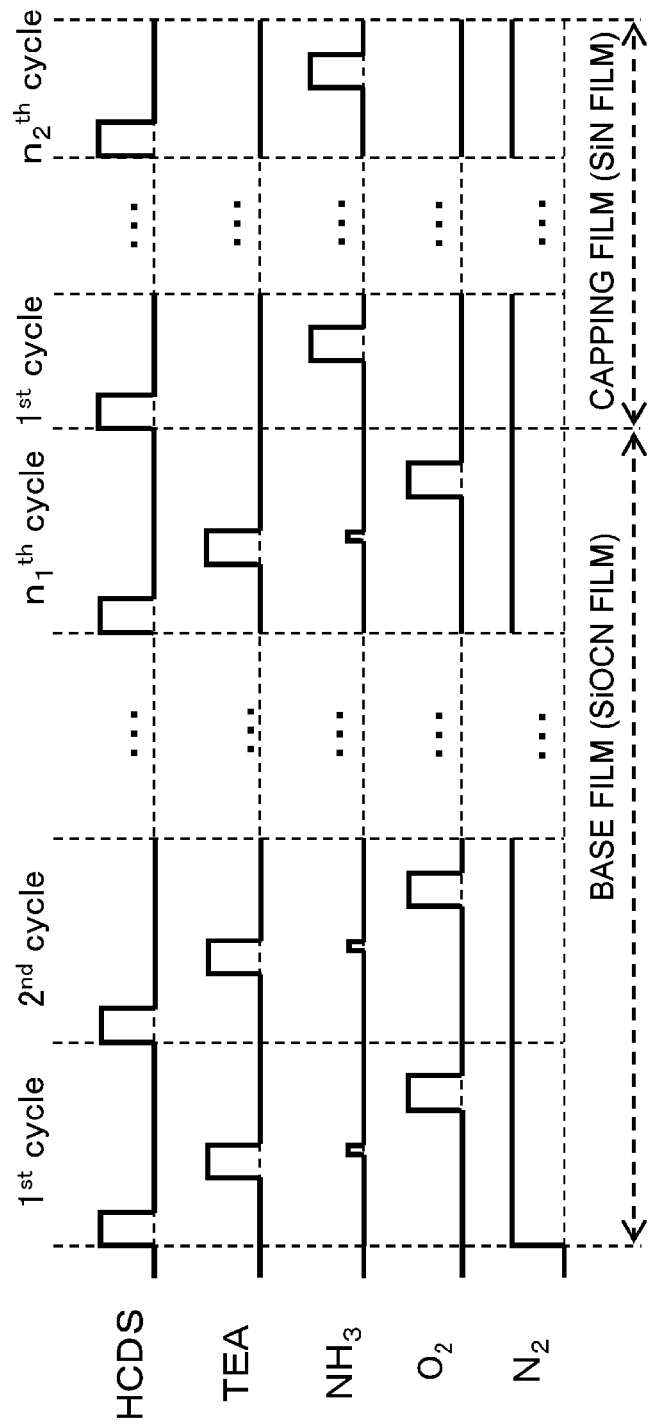

A fourth sample is a stacked film formed by stacking a SiOCN film (base film) and SiN film (capping film) on a wafer according to the film forming sequence illustrated in FIG. 4C. The base film is formed under the same processing conditions as those applied when the first sample is formed. The processing conditions applied when forming the capping film fall in the ranges of the processing conditions of the above-described embodiment. The thickness of the base film is 55 Å, the thickness of the capping film is 15 Å, and the thickness of the stacked film is 70 Å.

Next, the dielectric constants of the films of the first to fourth samples were measured. FIG. 5A illustrates the cross-sectional structures and dielectric constants (k values) of the respective films of the first to third samples. Referring to FIG. 5A, the k value of the SiOCN film in the first sample having no capping film is 4.4. In the second sample, the k value of the base film (SiOCN film) is 4.4, the k value of the capping film (O-poor SiOCN film) is 5.2, and the k value of the entire stacked film is 4.74. In the third sample, the k value of the base film (SiOCN film) is 4.4, the k value of the capping film (SiCN film) is 8.0, and the k value of the entire stacked film is 5.43. In the fourth sample, the k value of the base film (SiOCN film) is 4.4, the k value of the capping film (SiN film) is 7.0, and the k value of the entire stacked film is 4.96. These results show that, when the film is formed according to the film forming sequence illustrated in FIG. 4A, it is possible to more easily suppress an increase of the k values than when the films are formed according to the film forming sequences illustrated in FIGS. 4B and 4C.

In order to check the etching resistances and ashing resistances of the respective films of the first to fourth samples, two kinds of etching tests were conducted. The first etching test is to measure etched amounts of the films of the first to fourth samples, after performing an etching process of supplying 1% HF solution to the surfaces of the respective films for 60 seconds, without performing an ashing process. The second etching test is to measure etched amounts of the films of the first to fourth samples, after performing an ashing process of supplying $O_2$ plasma to the surfaces of the respective films and then performing an etching process according to substantially the same processing sequence and conditions as the first etching test. The first etching test can evaluate the etching resistances of the respective films. The second etching test can evaluate the ashing resistances of the respective films.

Figure 5B:
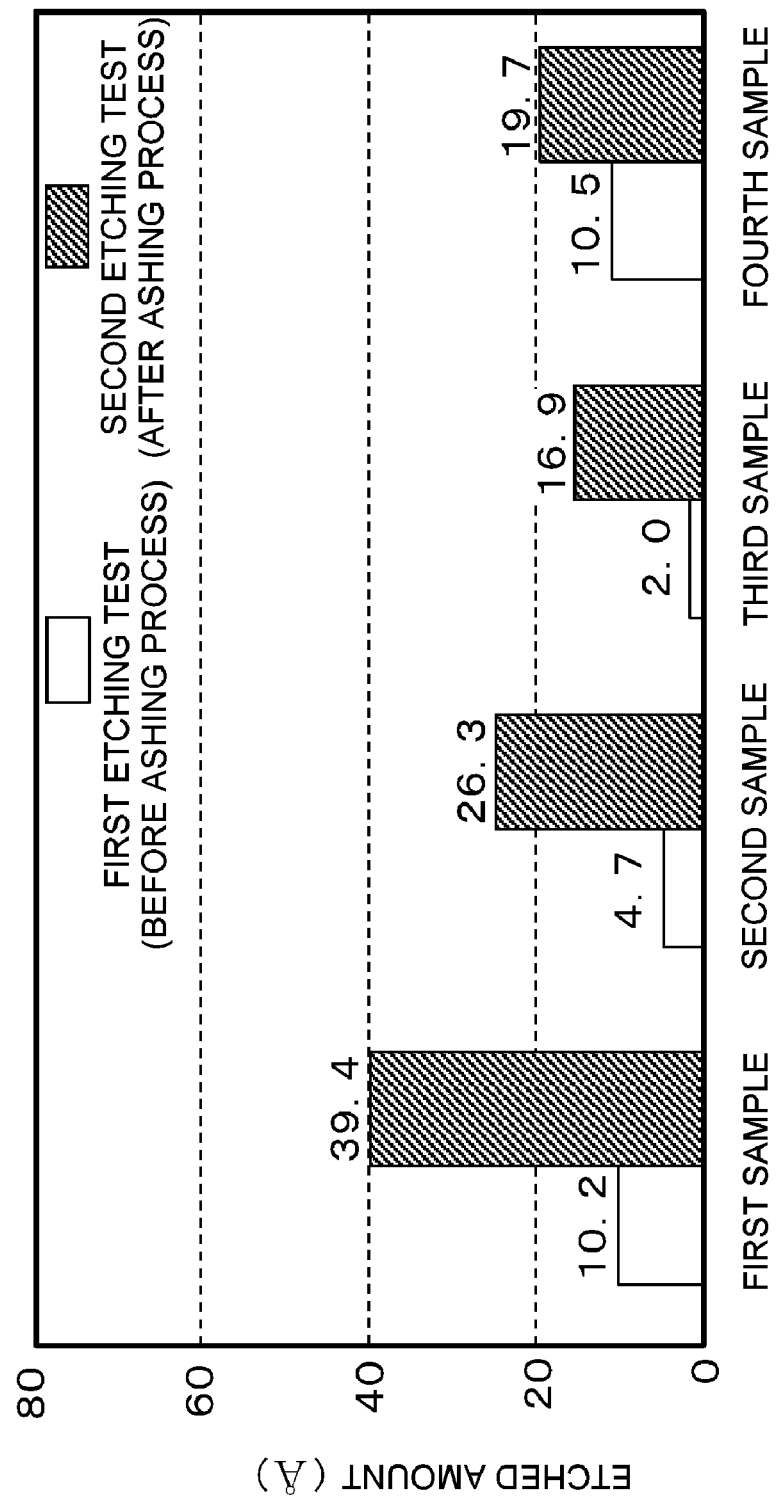
FIG. 5B is a diagram exemplifying results obtained by etching resistances and ashing resistances of the films formed on the substrate.

FIG. 5B illustrates the results of the first and second etching tests for the respective films of the first to fourth samples. In FIG. 5B, the horizontal axis indicates the first to fourth samples, and the vertical axis indicates the etched amounts Å. In FIG. 5B, a white bar graph and a hatched bar graph indicate the result of the first etching test and the result of the second etching test.

Referring to FIG. 5B, the etched amounts according to the first etching test increase in order of the third sample, the second sample, the first sample and the fourth sample. That is, the third sample has the smallest etched amount. In other words, the etching resistances decrease in order of the third sample, the second sample, the first sample and the fourth sample. That is, the film of the third sample has the largest etching resistance. Such a result is because the carbon concentrations of the surfaces of the films decrease in order of the third sample, the second sample, the first sample and the fourth sample, that is, the carbon concentration of the surface of the third sample is the largest. According to this result, the capping film which is formed according to the film forming sequence illustrated in FIG. 4A or 4B can strengthen the etching resistance of the film formed on the wafer.

Referring to FIG. 5B, the etched amounts according to the second etching test increase in order of the third sample, the fourth sample, the second sample and the first sample. That is, the third sample has the smallest etched amount. In other words, the ashing resistances decrease in order of the third sample, the fourth sample, the second sample and the first sample. That is, the third sample has the largest ashing resistance. Such a result is because the balance between the nitrogen concentration and the carbon concentrations at the surfaces of the films is established. In the second etching test, the etched amount of the first sample is larger than the etched amounts of the second to fourth samples. Such a result is because, since the nitrogen concentration at the surface of the first sample is relatively low, the first sample is more easily oxidized by the ashing process than the second to fourth samples, and a large amount of carbon is easily desorbed from the surface of the first sample. According to this result, the capping film which is formed on the top surface of the base film according to the film forming sequences illustrated in FIG. FIGS. 4A to 4C can strengthen the ashing resistance of the stacked film formed on the wafer.

According to the above-described results, when the stacked film is formed according to the film forming sequence illustrated in FIG. 4A, the balance of the three characteristics of low dielectric constant, high etching resistance and high ashing resistance, which have a trade-off relation, may be properly maintained. When the stacked film is formed according to the film forming sequence illustrated in FIG. 4B, the etching resistance and ashing resistance among the three characteristics can be selectively strengthened while the balance of the three characteristics is properly maintained. When the stacked film is formed according to the film forming sequence illustrated in FIG. 4C, the ashing resistance among the three characteristics can be selectively strengthened while the balance of the three characteristics is properly maintained.

According to the technique described herein, the characteristics of a film formed on a substrate can be improved.

What is claimed is:

1. A method of manufacturing a semiconductor device, comprising:
    (a) forming a first film on a substrate by supplying first gases containing a predetermined element, oxygen, carbon and nitrogen, wherein the first gases comprise an oxygen-containing gas; and
    (b) forming a second film thinner than the first film on a top surface of the first film by supplying second gases containing the predetermined element, oxygen, carbon and nitrogen, wherein the second gases comprise an oxygen-containing gas, and a concentration of each of the predetermined element, oxygen, carbon and nitrogen in the second gases is greater than zero, and
    wherein at least one selected from the group consisting of a supply duration, a flow rate, a partial pressure, and a concentration of the oxygen-containing gas in the second gases supplied in (b) is less than that of the oxygen-containing gas in the first gases supplied in (a) such that the second film has an oxygen concentration lower than an oxygen concentration of the first film or has oxygen and carbon concentrations lower than oxygen and carbon concentrations of the first film.

2. The method of claim 1, wherein a thickness of the second film ranges from 1 nm to 2 nm.

3. The method of claim 1, wherein the second film comprises the predetermined element, oxygen, carbon and nitrogen.

4. The method of claim 1, wherein the second film comprises the predetermined element, carbon and nitrogen.

5. The method of claim 1, wherein the second film comprises the predetermined element and nitrogen.

6. The method of claim 1, wherein a nitrogen concentration of the first film is lower than the carbon concentration of the first film.

7. The method of claim 1, wherein (a) comprises supplying at least one gas selected from a group consisting of a gas containing the predetermined element, a gas containing the predetermined element and carbon, a gas containing carbon and nitrogen, a carbon-containing gas, a nitrogen-containing gas and a first oxygen-containing gas to the substrate, and (b) comprises supplying at least one gas selected from the group consisting of the gas containing the predetermined element, the gas containing the predetermined element and carbon, the gas containing carbon and nitrogen, the carbon-containing gas, the nitrogen-containing gas and the first oxygen-containing gas to the substrate.

8. The method of claim 1, wherein (a) comprises performing a cycle a predetermined number of times, the cycle comprising: (a-1) supplying at least one gas selected from a group consisting of a gas containing the predetermined element and a gas containing the predetermined element and carbon to the substrate; (a-2) supplying at least one gas selected from a group consisting of a gas containing carbon and nitrogen, a carbon-containing gas and a nitrogen-containing gas to the substrate; and (a-3) supplying a first oxygen-containing gas to the substrate.

9. The method of claim 8, wherein (b) comprises performing a cycle comprising: (a-1), (a-2) and (a-3) a predetermined number of times.

10. The method of claim 9, wherein an amount of the first oxygen-containing gas supplied in each cycle of (b) is smaller than an amount of the first oxygen-containing gas supplied in each cycle of (a).

11. The method of claim 9, wherein a supply duration of the first oxygen-containing gas supplied in each cycle of (b) is shorter than a supply duration of the first oxygen-containing gas supplied in each cycle of (a), or at least one of flow rate, partial pressure and concentration of the first oxygen-containing gas supplied in each cycle of (b) is lower than at least one of flow rate, partial pressure and concentration of the first oxygen-containing gas supplied in each cycle of (a), respectively.

12. The method of claim 8, wherein (b) comprises performing a cycle a predetermined number of times, the cycle comprising: (b-1) supplying at least one gas selected from the group consisting of the gas containing the predetermined element and the gas containing the predetermined element and carbon to the substrate; (b-2) supplying at least one gas selected from the group consisting of the gas containing carbon and nitrogen, the carbon-containing gas and the nitrogen-containing gas to the substrate; and (b-3) supplying a second oxygen-containing gas to the substrate, the second oxygen-containing gas having: a molecular structure different from a molecular structure of the first oxygen-containing gas; and an oxidative power lower than an oxidative power of the first oxygen-containing gas.

13. The method of claim 8, wherein (b) comprises performing a cycle comprising: (a-1) and (a-2) a predetermined number of times.

14. The method of claim 8, wherein (b) comprises performing a cycle a predetermined number of times, the cycle comprising: (b-1) supplying the gas containing the predetermined element to the substrate; and (b-2) supplying the nitrogen-containing gas to the substrate.

15. The method of claim 14, wherein a flow rate of the nitrogen-containing gas supplied in (b) is greater than a flow rate of the nitrogen-containing gas supplied in (a).

16. The method of claim 1, wherein a carbon concentration of the second film is lower than a carbon concentration of the first film.

* * * * *